US009040889B2

(12) United States Patent
Ay

(10) Patent No.: US 9,040,889 B2
(45) Date of Patent: *May 26, 2015

(54) ANALOG-TO-DIGITAL CONVERTER WITH PROGRAMMABLE RAMP GENERATOR

(75) Inventor: Suat Utku Ay, Moscow, ID (US)

(73) Assignee: University of Idaho, Moscow, ID (US)

( * ) Notice: Subject to any disclaimer, the term of this patent is extended or adjusted under 35 U.S.C. 154(b) by 759 days.

This patent is subject to a terminal disclaimer.

(21) Appl. No.: 13/321,530

(22) PCT Filed: Jun. 25, 2010

(86) PCT No.: PCT/US2010/040050

§ 371 (c)(1), (2), (4) Date: Nov. 18, 2011

(87) PCT Pub. No.: WO2010/151806

PCT Pub. Date: Dec. 29, 2010

(65) Prior Publication Data

US 2012/0061555 A1 Mar. 15, 2012

(51) Int. Cl.

*H01L 27/00* (2006.01)
*H03M 1/12* (2006.01)
*H04N 5/378* (2011.01)
*H03M 1/56* (2006.01)

(52) U.S. Cl.

CPC ................ *H03M 1/123* (2013.01); *H03M 1/56* (2013.01); *H04N 5/378* (2013.01)

(58) Field of Classification Search

CPC ......... H03M 1/123; H03M 1/56; H03M 1/12; H04N 5/378; H01L 27/146

USPC ................. 250/208.1; 348/211.5, 211.6, 230

See application file for complete search history.

(56) References Cited

U.S. PATENT DOCUMENTS

2006/0164277 A1* 7/2006 Lee .............................. 341/155
2006/0220941 A1* 10/2006 Lee .............................. 341/155
2009/0033532 A1* 2/2009 Reshef et al. ................ 341/137

FOREIGN PATENT DOCUMENTS

WO WO 2009/158506 12/2009

OTHER PUBLICATIONS

FZ Nelson et al., *A Single-Slope Look-Ahead Ramp (SSLAR) ADC for Column Parallel CMOS Image Sensors,* Microelectronics and Electron Devices, Apr. 3, 2009, pp. 1-4.

International Search Report issued in PCT/US2010/040050, dated Feb. 14, 2011.

* cited by examiner

*Primary Examiner* — Georgia Y Epps
*Assistant Examiner* — Kevin Wyatt
(74) *Attorney, Agent, or Firm* — Klarquist Sparkman, LLP

(57) ABSTRACT

An analog-to-digital (ADC) converter is disclosed that uses aspects of a single-slope ramp ADC, but with jump steps in the ramp voltage to increase speed. A programmable ramp generator can be used to dynamically modify a voltage level associated with the jump step. By programming a voltage level of the jump, a user can dynamically modify the speed of the ADC during operation.

22 Claims, 31 Drawing Sheets

500
502
504
520
550
Vin[m]
Vin[m-1]
Vin[2]
Vin[1]
Vin[0]
Predictor
Latches
Data[m]
Data[m-1]
Data[2]
Data[1]
Data[0]
n
506
Vramp
jump 530
Vpred
532
jump
Count_out
507
508
Ramp Generator with Jump
Look Ahead Controller
Counter with Jump
540
look
V_high
V_low
LAC_clk
LAC_Vref1,2
Count_clk Vin[m]
Vin[m-1]
Vin[2]
Vin[1]
Vin[0]
Latches
Data[m]
Data[m-1]
Data[2]
Data[1]
Data[0]
Cp
n
520
502
504
602
550
532
530
Vramp
Vpred
Count_out
jump
look
Ramp Generator with Jump
Look-Ahead Controller
Counter with Jump
$V_{high}$
$V_{low}$
LAC_clk
LAC_Vref1,2
Count_clk 700
lookb
jumpb
701
jump
706
Comparator
702
Vbias
LAC_Vref1
702
710
708
705
look
532
Vpred
704
LAC_Vref2

N-Bit Synchronous Counter with jump and look
Binary Weighted Capacitor Bank with switches
N-Bit D-Flip Flop
N-Bit synchronous counter with jump/look
Hold
Jump
Clk
$D_0$-$D_9$
$S_0$-$S_9$
$S_0$-$S_9$
$V_{Ramp}$
$V_{Top}$
$V_{Bot}$
$V_{Bot}$
$V_{AA}$
$S_{RST}$
$S_{JMP}$
$C_{Jump}$
$V_{Out}$
D
Q
CLK
Look
Jumpb
Clk
705
701
801
802
804
806
808
1010

802
901
701
Jumpb
801
Hold
Clk
D
Q
CLK
D0
D1
D2
D3
D4
D5
D6
D7
D8
D9

Count_clk
Count_out
705
look
lookb
706
jump
Vramp
$T_{clk}$
t-1
t
t+(k/2)
t+1
t+2
$h^*T_{clk}$
k- step
jump
ahead
original ramp
trajectory
Lost
$h^*T_{clk}$ Count_clk
Count_out
705
look
lookb
706
jump
Vramp
$T_{clk}$
t-1
t
t+(k/2)
t+k
t+k+1
t+k+2
$h^*T_{clk}$
k- step
jump
ahead
Saving
$(k-h)^*T_{clk}$
original ramp
trajectory

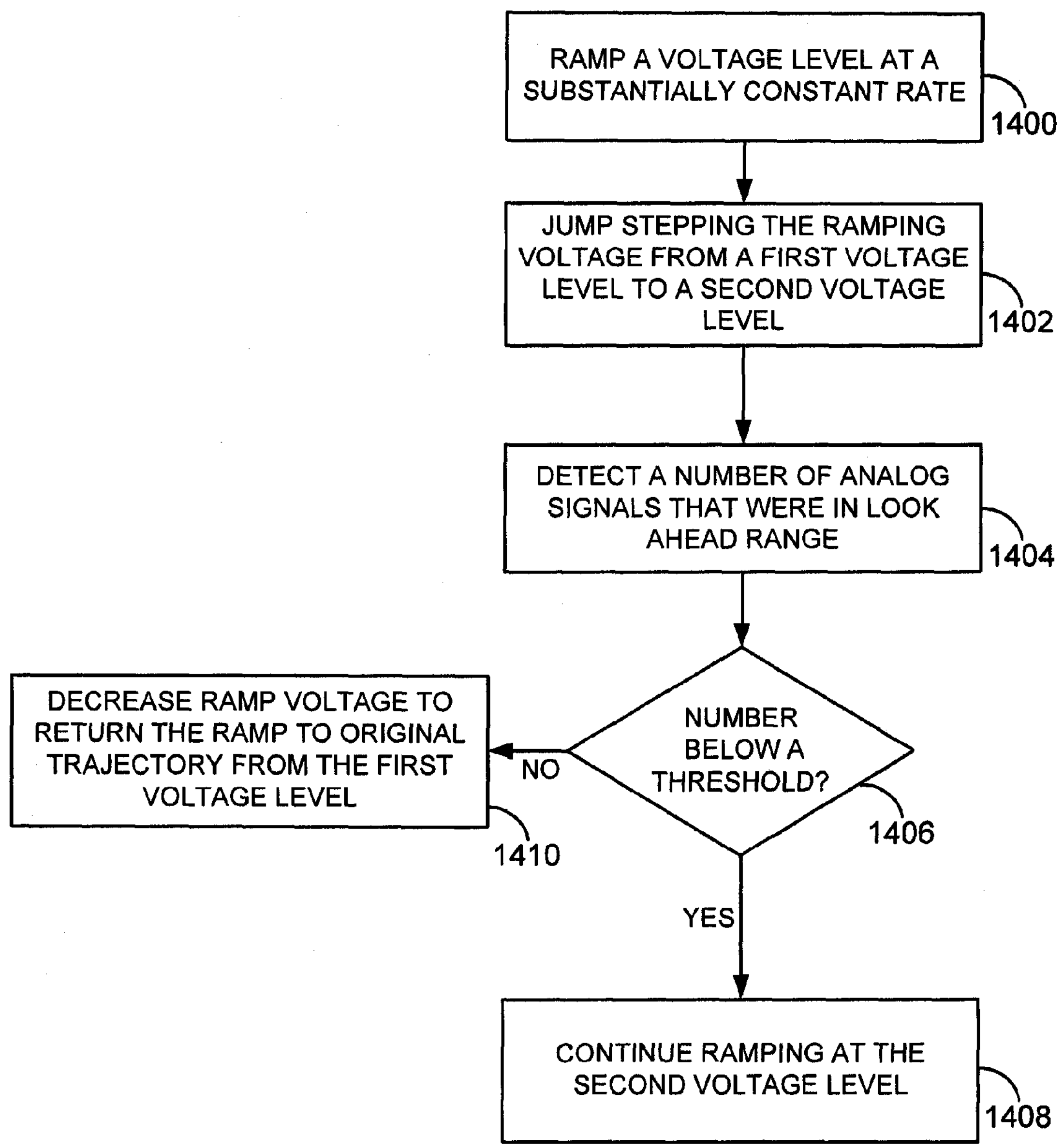
FIG. 14
RAMP A VOLTAGE LEVEL AT A SUBSTANTIALLY CONSTANT RATE
1400
JUMP STEPPING THE RAMPING VOLTAGE FROM A FIRST VOLTAGE LEVEL TO A SECOND VOLTAGE LEVEL
1402
DETECT A NUMBER OF ANALOG SIGNALS THAT WERE IN LOOK AHEAD RANGE
1404
NUMBER BELOW A THRESHOLD?
1406
NO
DECREASE RAMP VOLTAGE TO RETURN THE RAMP TO ORIGINAL TRAJECTORY FROM THE FIRST VOLTAGE LEVEL
1410
YES
CONTINUE RAMPING AT THE SECOND VOLTAGE LEVEL
1408

SAMPLE ROW OF PIXELS
1502
START RAMP AND COUNTER
1504
JUMP K STEPS FOR RAMP ANALOG SIGNAL AND K/2 STEPS IN COUNTER
1506
1510
MAINTAIN JUMPED RAMP VOLTAGE AND INCREASE COUNTER BY K/2
NUMBER ABOVE THRESHOLD?
NO
1508
YES
DECREASE RAMP VOLTAGE TO RETURN TO ORIGINAL TRAJECTORY, DECREASE COUNTER BY K/2, AND DIGITIZE OUTPUT USING ONE LSB AT A TIME
1512
1516
1514
LAST ROW
NO
END OF RANGES?
NO
YES
YES
1518
END

1700
LOOK-AHEAD
CONTROLLER
1704
Step Word
P[6:0]
Step Word
P[6:0]
1706
1708
1702
SSLAR
Event
Detector
(ED)
Look
Jump
SSLAR
Controller
(CONT)
SSLAR
Ramp-Count
Generator
(RCG)
Vramp
Cnt[7:0]
Scan_done
to Column
to / from
Column
1710
Bias/ Reference
mclk
rst
Bias/Reference
1712

1800
S0
rst-1
rst-0
S1
jump=0
jump=1
S4
S2
jump=0
jump-1
done-0
S5
S3
done-1

1708
1910
1906
Step program word
P[6:0]
rst
mclk
1902
C_en
Logic
Synchronous
Counter
(7-bit)
jump
CONT FSM
SC[6:0]
done
Digital Comparator
(7-bit)
Logic/Buffer
1904
CONT Outputs
1908

ANALOG-TO-DIGITAL CONVERTER WITH PROGRAMMABLE RAMP GENERATOR

CROSS REFERENCE TO RELATED APPLICATION

This is the U.S. National Stage of International Application No. PCT/US2010/040050, filed Jun. 25, 2010, which claims priority to International Application No. PCT/US2010/048670, filed Jun. 25, 2009, which in turn claims the benefit of U.S. Provisional Patent Application No. 61/133,260, filed Jun. 26, 2008, and entitled "SINGLE-SLOPE LOOK-AHEAD-RAMP (SSLAR) ANALOG-TO-DIGITAL CONVERTER (ADC) FOR COLUMN PARALLEL CMOS IMAGE SENSOR," all of which applications are incorporated herein by reference in their entireties.

FIELD

The present application relates generally to analog-to-digital (ADC) converters and, more particularly, to an ADC that can be beneficial in CMOS image sensing.

BACKGROUND

Single-slope ramp analog-to-digital converters (SSR-ADC) are used in ICs for converting analog signals into digital. A simple SSR-ADC architecture 100 is shown in FIG. 1. A ramp generator 120 generates a sloping voltage level between two input voltages, $V_{low}$ and $V_{high}$. The ramp generator 120 is coupled to a comparator 140, which compares an analog input signal $V_{in}$, to be digitized, to the ramped input voltage from the ramp generator. An n-bit counter 160 (in this example, a 3 bit counter) is coupled to a latch 180. The latch 180 is responsive to a change in the output of the comparator 140 to latch a current value of a count from the counter 160. A timing diagram illustrates the operation in FIG. 2. In this example, the ramp signal is increased between 1 and 2 volts, while the analog input voltage Vin is set to 1.7 volt. The counter 160 starts counting in sync with the start of the ramp signal's increase in voltage. The latch 180 is transparent and "passes" counter digital bits to the data output as long as the ramp signal is below the analog input voltage Vin. Once the ramp voltage exceeds the input voltage, the comparator output voltage switches causing the latch to hold the last counter word, which represents the analog signal Vin in digital form.

One problem with SSR-ADCs is the analog-to-digital conversion speed. To convert an analog signal into a digital n-bit word, SSR-ADC requires $2^n$ times the master clock cycle. For example, a 10-bit representation of an analog signal can be converted into digital form after 1024 clock cycles. SSR-ADC is considered slow when compared with other ADC topologies, such as Flash ADC, which requires only 1 clock cycle for conversion, or Successive Approximation Register (SAR) ADC, which requires n-clock cycles for conversion.

SSR-ADC, however, is very suitable for column-parallel integration in image sensors, such as CMOS image sensors. One such image sensor is shown in FIG. 3. A pixel array 300 outputs row data onto shared column lines as controlled by a row decoder 320. Each column's pixel signal is read by an analog signal processor (ASP) 340, which passes the processed data to a plurality of ADCs 360. The ADCs 360 scanned by column decoder 380 sequentially output the data to a column bus 381, which is connected to a digital signal processor (DSP) 390. The DSP 390 processes and outputs the data in digital form. Column parallel architectures have m-number of ADCs integrated together, working in parallel to convert m-number of analog signals at the same time.

FIG. 4 shows the structure of the SSR-ADCs 360 integrated in CMOS image sensor columns. As can be seen, only one ramp generator 400 is used to provide a ramp signal to multiple comparators 420 coupled in parallel. A global counter 440 is coupled to m, n-bit transparent digital latches 460. Although the SSR-ADC operates at a much slower speed than SAR-ADC or Flash ADC, it requires much less power and requires smaller integrated circuit (IC) area. Nonetheless, it is desirable to increase the speed of ADCs used in image sensors, while maintaining the benefits of SSR-ADCs.

SUMMARY

A method and apparatus are disclosed for increasing the speed of an analog-to-digital converter (ADC). One application of the ADC is in a column-parallel CMOS image sensor.

In one embodiment, a programmable jump step can be used to modify a ramped voltage from a substantially constant ramp to insert a jump step in voltage. The jump step represents an interruption in the constant ramped voltage. For example, the constant ramp can be formed by substantially continuous steps of X millivolts, each having a duration of Y microseconds. The jump step breaks the continuous steps to insert a jump in voltage that is at least 2×, but can be anywhere from 2 times to $2^n$ (where n is a number of ADC bits and can be any number) times higher than the voltage steps during the continuous ramping. Thus, a deviation in the trajectory of the ramp is created. In one example, an approximately 15× jump step in voltage is used. As the jump step is programmable, a user can dynamically modify the jump step voltage level in order to increase the speed of the analog to digital conversion.

After the programmed jump step from a first voltage level to a second voltage level, a test can be performed to detect the number of analog input signals impacted due to the jump step (i.e., the number of analog input signals between the first and second voltage levels). If the detected number is below a predetermined threshold, then the ramp can be maintained from the new voltage level after the jump. If the detected number is above the predetermined threshold, then the ramped voltage level can be returned to the first voltage level so that the analog input signals can be digitized using the ramped voltage level from its original level and trajectory. Consequently, the ADC uses components of a single-slope ramp ADC, but with one or more jump steps in voltage level that break the trajectory of the constant ramp in order to increase speed in converting an analog input to digital.

In another embodiment, a finite state machine is used to implement the programmable jump in ramp voltage. The state machine is responsive to a jump signal and controls whether the jump step in voltage is maintained or the voltage level is returned to its original trajectory.

The foregoing features and advantages will become more apparent from the following detailed description, which proceeds with reference to the accompanying figures.

BRIEF DESCRIPTION OF THE DRAWINGS

FIG. 14 is a flowchart of a method for jumping that can be used in the ADC of FIG. 5.

DETAILED DESCRIPTION

As used herein, the singular terms "a," "an," and "the" include plural referents unless context clearly indicates otherwise. Similarly, the word "or" is intended to include "and" unless the context clearly indicates otherwise. Also, as used herein, the term "comprises" means "includes." Hence "comprising A or B" means including A, B, or A and B. Although many methods and materials similar or equivalent to those described herein can be used, particular suitable methods and materials are described below. In case of conflict, the present specification, including explanations of terms, will control. In addition, the materials, methods, and examples are illustrative only and not intended to be limiting.

Figure 1:
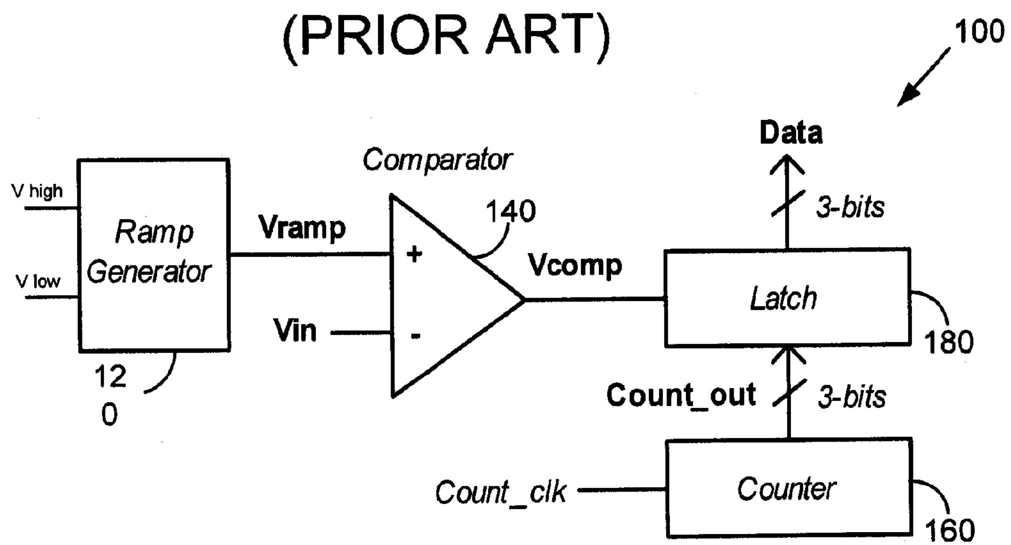
FIG. 1 is a circuit diagram of a conventional single slope ADC.
Figure 2:
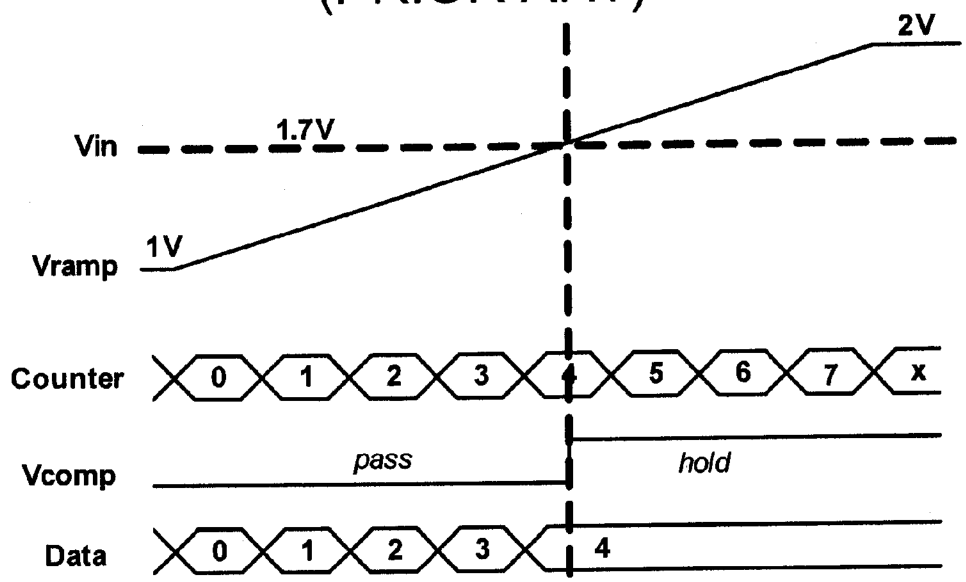
FIG. 2 is a timing diagram of the operation of the ADC of FIG. 1.
Figure 3:
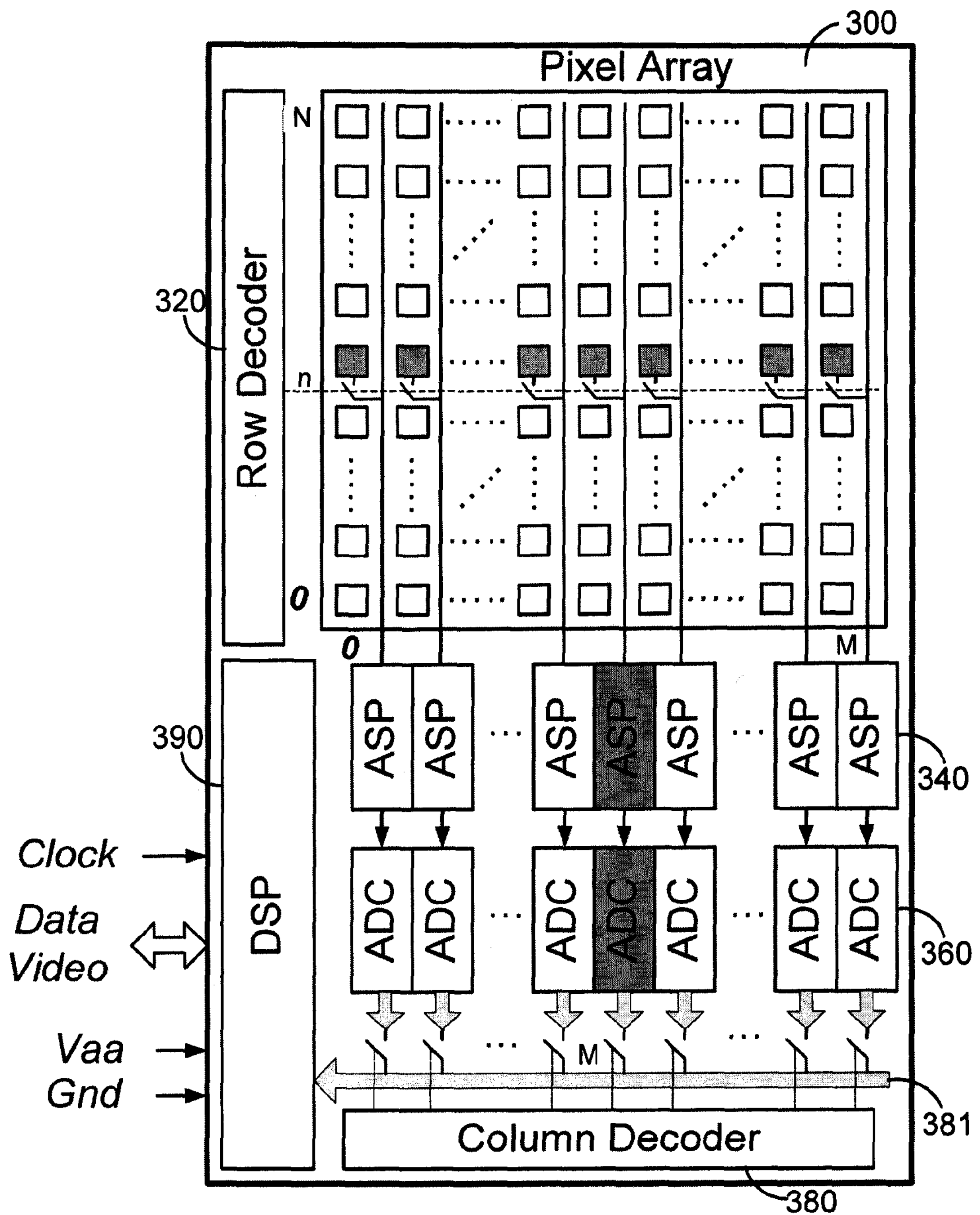
FIG. 3 is circuit diagram of a conventional CMOS image sensor with a column parallel architecture.
Figure 4:
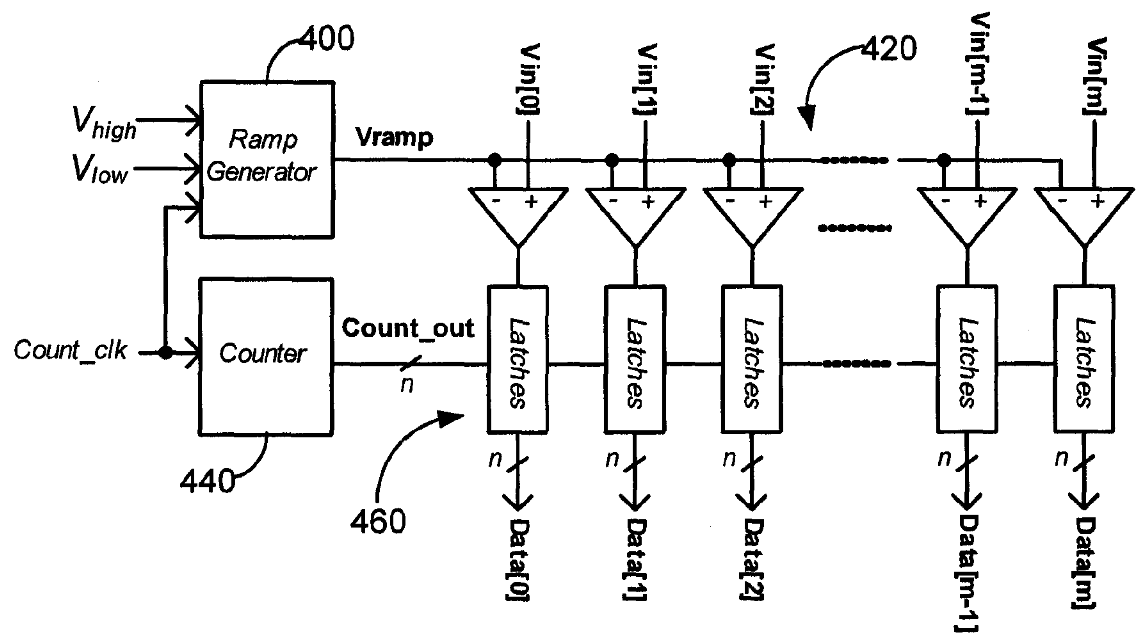
FIG. 4 is a circuit diagram of a conventional single slope ADC used in the CMOS image sensor of FIG. 3.
Figure 5:
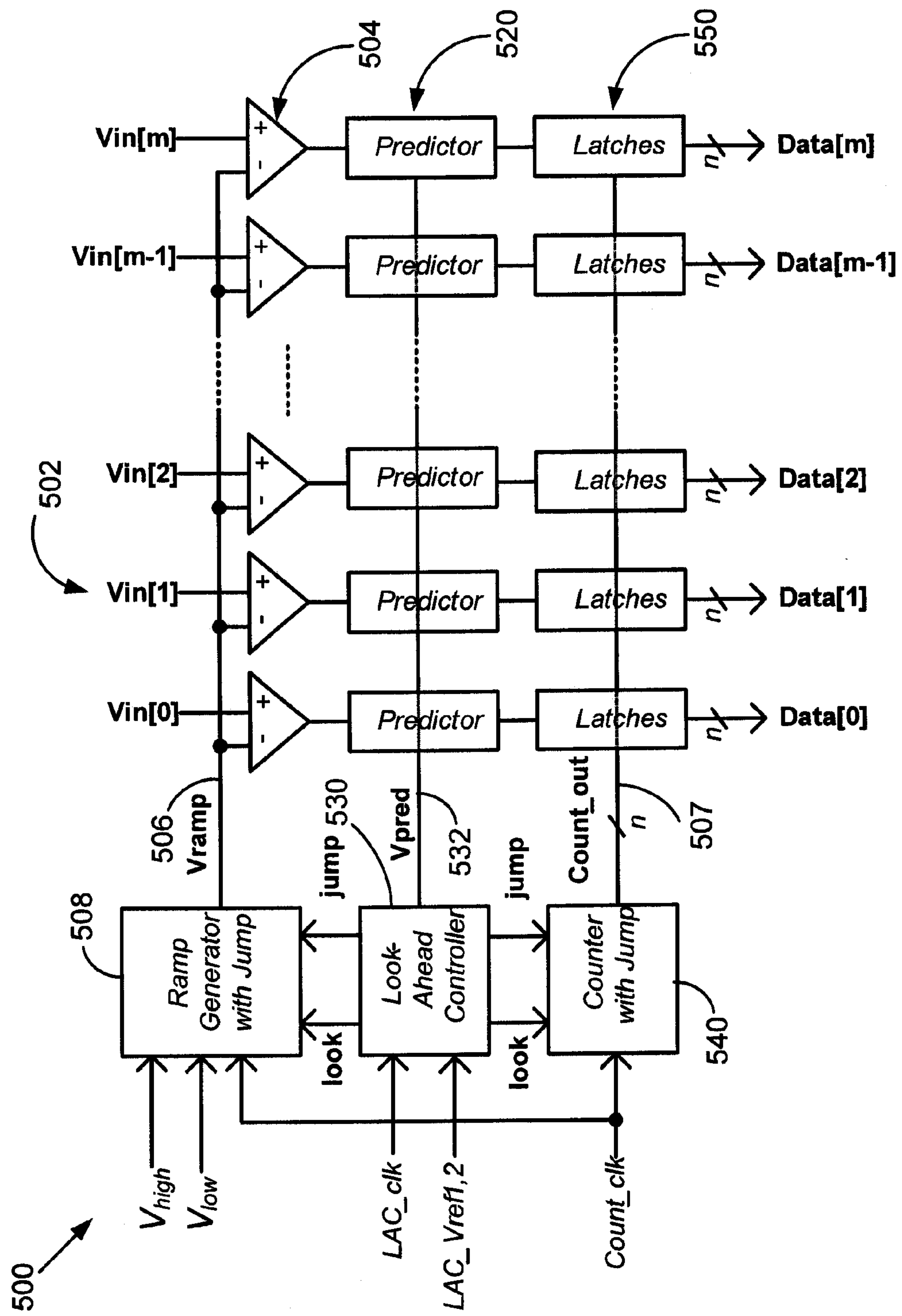
FIG. 5 is a circuit diagram of an ADC, in accordance with one embodiment of the present disclosure, with a predictor circuit and a look-ahead controller.

FIG. 5 is a circuit diagram 500 of an ADC that can be used in the CMOS image sensor of FIG. 3 or other such image sensors. Input voltage signals 502 can be coupled to columns of a pixel array, such as the pixel array 300. A plurality of comparators 504 (desirably, one per column) can have a first input coupled to the input voltage signals (such as on the positive terminal), while the second inputs (such as the negative terminal) can be coupled to a common Vramp signal line 506. The Vramp signal line 506 provides a Vramp signal from a ramp generator 508, as further described below. The plurality of comparators 504 have comparator outputs coupled to a plurality of predictor circuits 520 in a one-to-one fashion. As further described below, the predictor circuits 520 determine a number of comparator output signals that are affected by a jump step in the Vramp signal. A change in the comparator signal also indicates that the input voltage level associated with the comparator is somewhere between a low and high value of the jump step. In this sense, digitizing of the input voltage level is impacted by the jump step in that it was not properly converted to digital using a constant ramping voltage. The predictor circuit can detect a change in the comparator outputs due to the Vramp signal exceeding one or more Vin signals. If the number of input voltage signals 502 impacted by the jump step exceeds a predetermined threshold, then the jump in the Vramp signal can cause the error rate to be higher than desired. As a result, corrective action can be taken, such as returning the Vramp signal to the state it was before the jump occurred. The decision of whether to proceed with the jump or to jump back is made in a look-ahead controller circuit 530. In particular, outputs of the predictor circuits 520 are coupled together and to a Vpred signal line 532, which can be input into the look-ahead controller circuit 530. The look-ahead controller circuit 530 is coupled to both the ramp generator 508 and a counter 540. In any event, the predictor circuits 520 pass the comparator outputs to a plurality of latches 550. When the Vramp signal 506 exceeds one of the input voltage signals 502, the comparator 504 associated with that particular input voltage signal switches state causing the associated latch 550 to latch a current value of the counter 540, which represents the digital equivalent of the input voltage signal. It should be recognized that the desired structure is to have one comparator, one predictor and n-number of latches per column.

As described in more detail below, the look-ahead controller 530 uses the input signal on the Vpred signal line 532 in order to decide whether to maintain a jump ahead or to jump back. During an initial period, the ramp generator 508 can begin to ramp its output voltage at a substantially constant rate of increase. For example, on each clock cycle, the voltage may increase a predetermined amount (a discrete step). The look-ahead controller 530 can instruct the ramp generator 508 to jump ahead and can instruct the counter 540 to jump ahead. By jumping, the ramp generator does a step in voltage, rather than a continuous ramping. For example, the ramp generator can change the Vramp signal from a first voltage (e.g., 1.0 V) to a second voltage (1.2 V). Such a jump represents an increase of a multiple of the discrete steps so that the rate of increase is no longer constant. Additionally, jumping in the counter changes the counter count by more than one unit. For example, the count can change from 1 to 5, rather than from 1 to 2. When a jump in ramp voltage occurs, certain number of the comparators 504 will likely be affected causing them to change state. The predictor circuits 520 can detect a number of the comparator outputs that change state and report the same, on the Vpred line, to the look-ahead controller 530. If the number of comparators affected exceeds a predetermined threshold, the look-ahead controller 530 can instruct the ramp generator 508 to jump back to its pre-jump level (e.g., from 1.2V to 1.0V) and the ramp generator proceeds to ramp at a constant rate. Likewise, the counter can be instructed to jump back to its previous pre-jump count value (e.g., from 5 to 1). If the number affected does not exceed the predetermined threshold, then the look-ahead controller maintains the ramp generator 508 and the counter 540 at the jump-ahead states. In embodiments described below, the ramp generator 508 can be programmable so as to modify an amount of voltage increase associated with the jump step.

Those skilled in the art will readily appreciate that any desired relative values can be used for the jump step and the counter. In one exemplary embodiment, the voltage jumps S steps while the counter jumps S/2 steps. If the jump is approved, then the counter jumps an additional S/2 steps and both the ramp and the counter continue from S steps above the pre-jump step level. Other relative values can be used. For example, both the voltage and the counter can jump S steps.

Figure 6:
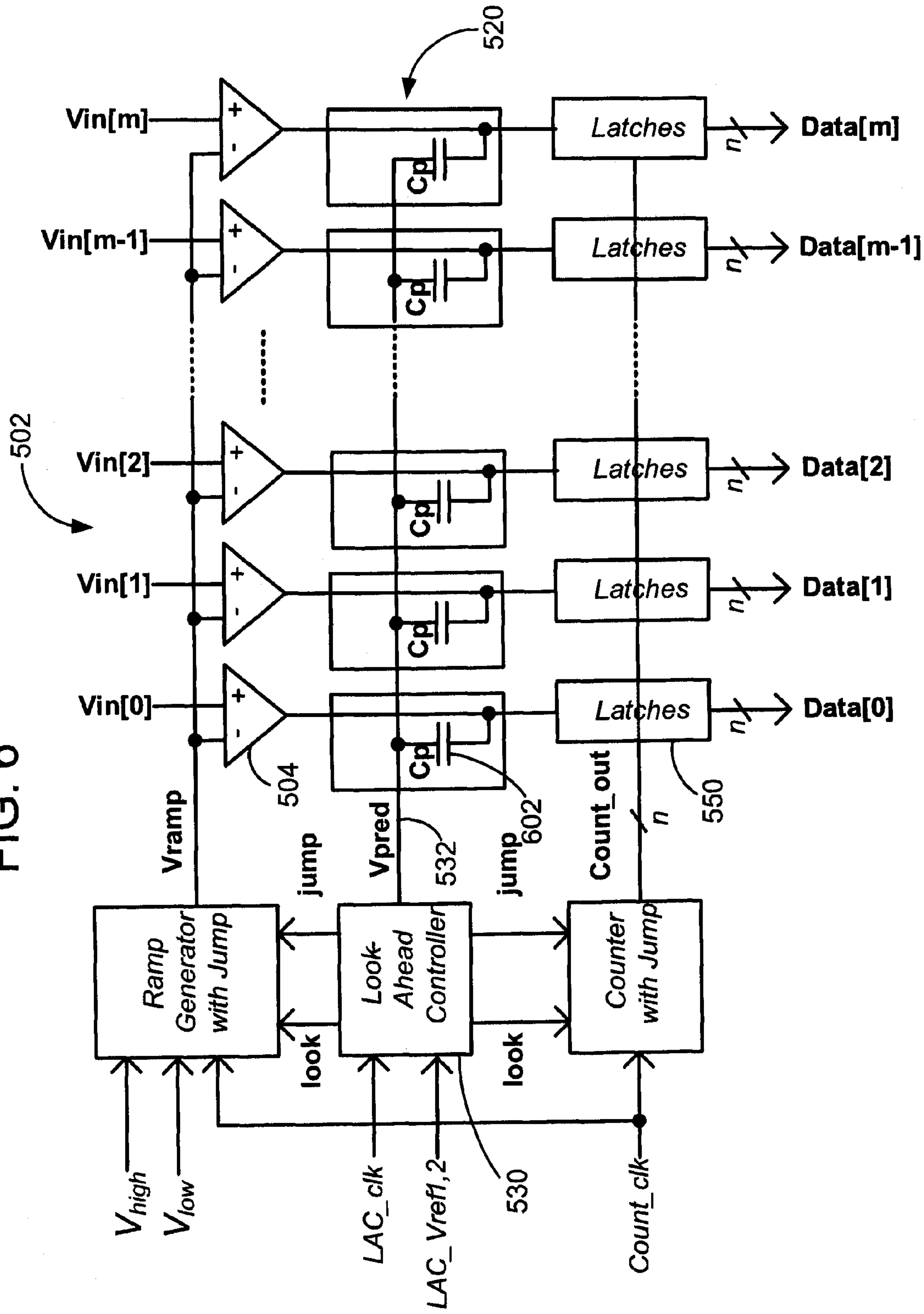
FIG. 6 is a more detailed circuit diagram of the predictor circuit that can be used in the ADC of FIG. 5.

FIG. 6 shows an embodiment of the predictor circuits 520. In this embodiment, the predictor circuits are capacitors 602 having one end thereof tied to the Vpred signal line 532 and the opposite end to a signal line extending between an output of the comparator 504 and an input of a latch 550. In this connection scheme, the predictor circuits 520 passively monitor the comparator outputs without changing or delaying the same. In operation, the Vpred line is charged to a certain voltage level that is changed each time the Vramp signal exceeds the Vin signals 502 from the pixel array. More particularly, each change in a comparator output changes a voltage level on the capacitor 602 extending between the comparator output and the Vpred line. Each capacitor associated with a column is coupled to the Vpred signal line 532 so that the look-ahead controller 530 can detect the number of predictor circuits 520 that were affected due to a jump in the Vramp voltage.

Figure 7:
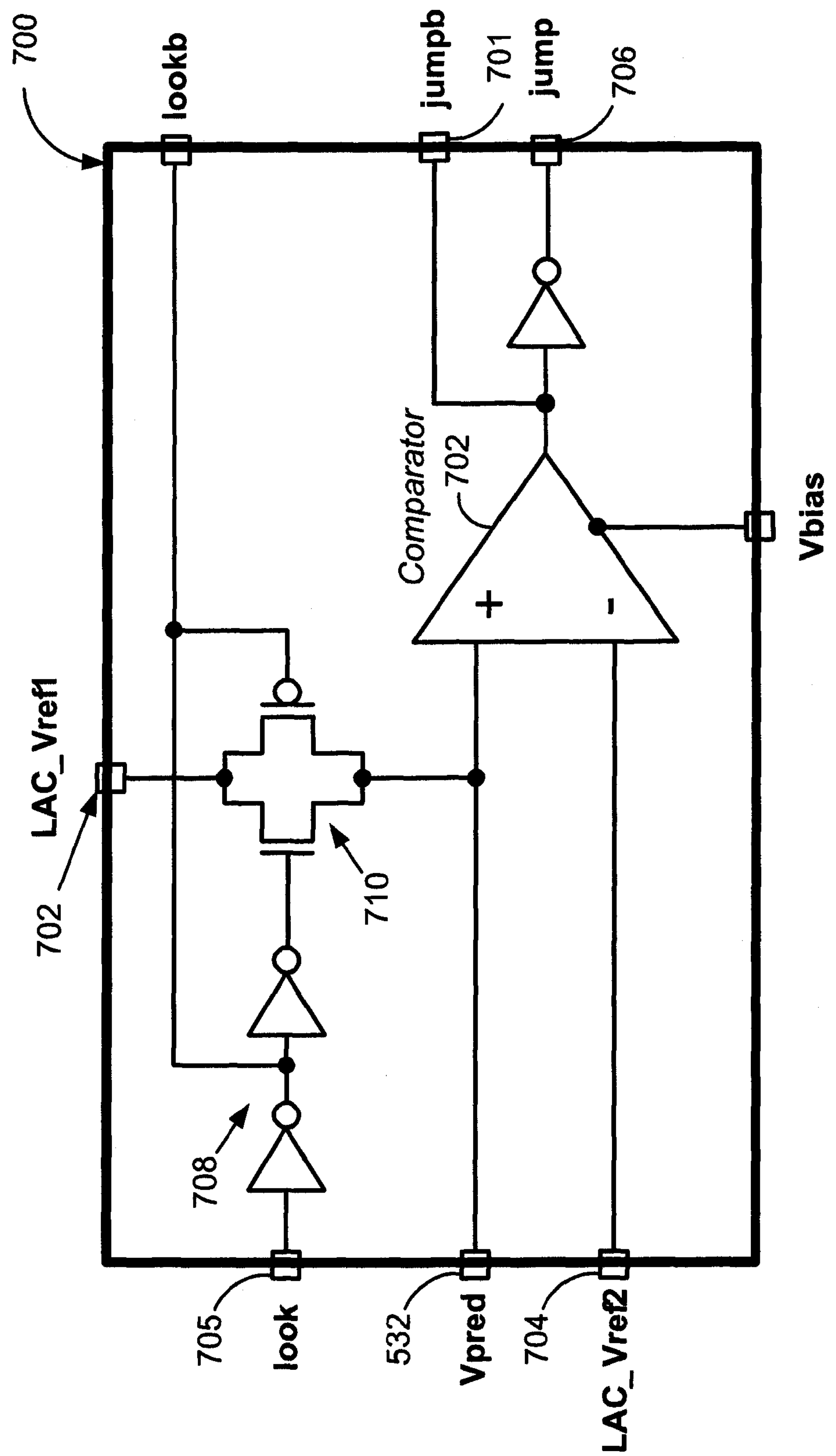
FIG. 7 is a more detailed circuit diagram of the look-ahead controller that can be used in the ADC of FIG. 5.

FIG. 7 shows an embodiment of event detector 700, which is the part of look-ahead controller 530 that can be used in the ADC of FIG. 5. The event detector 700 includes a comparator 702 that has two inputs, one coupled to the Vpred signal line 532 and a second coupled to a reference voltage LAC_Vref2 704. The comparator 702 output is coupled to a jumpb signal line 701. Inverse of the comparator 702 output is coupled to a jump signal line 706. The Vpred signal line 532 is pre-charged to a voltage level of LAC_Vref1 702 by a pair of transistors 710, which are switched on and off using a look signal on signal line 705. A proportional difference between these two reference voltages represents the threshold for the ADC. LAC_Vref1 702 is set to a desired threshold lower than LAC_Vref2 704 voltage level. With Vpred charged lower to LAC_Vref1 level, the comparator 702 outputs a high signal level to jump signal line 706 and jumpb signal line 701 is at low level. Once Vpred is larger than LAC_Vref2 due to enough of the input voltages 502 falling between the previous Vramp signal voltage level and current jumped Vramp signal voltage level, the comparator 702 switches state, generating a low signal on the jump signal line 706 and high on jumpb signal line 701.

As described further below, the ramp generator is also responsive to the look signal to create the k/2-step jump. If it is confirmed that any resulting error rate is acceptable, the jump signal is asserted by event detector 700 indicating that the jump is to be maintained. The look 705 signal is generated to test this case. An error rate is determined and, if the error rate is acceptable, the stepped-up Vramp voltage is maintained while counter stepped k/2-step ahead. If the error rate is not acceptable, both Vramp voltage and counter are returned to their original levels. The error rate is associated with the LAC_Vref1 input 702.

Figure 8:
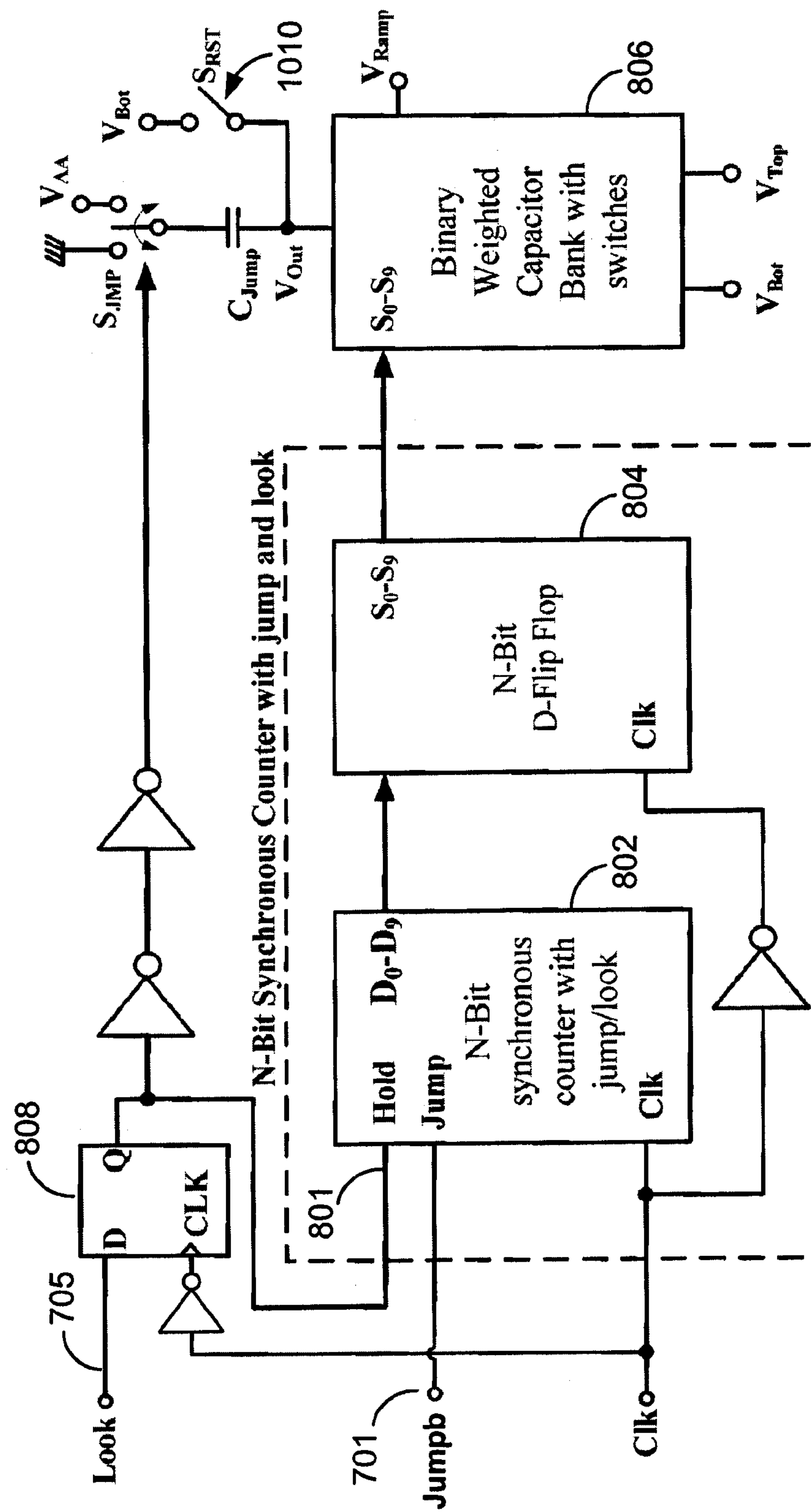
FIG. 8 is a more detailed circuit diagram of a ramp generator with a jump option that can be used in the ADC of FIG. 5.

FIG. 8 shows an example ramp generator 508 that can be used. In this example, the ramp generator is not programmable. The ramp generator 508 can include an n-bit synchronous counter 802, an n-bit D-flip flop 804, and a capacitor bank with switches 806 coupled in series. The look signal line 705 is input into a D flip-flop 808, whose output is used as a hold signal 801 for the counter 802. The positive edge D-flip flop 802 synchronizes the look ahead jump or fall back transitions of ramp generator with the clock. The synchronized look signal controls the switch SJMP to pump or dump charge from the node Vout through a capacitor CJump. The switches (S0-S9) 806 can be controlled during negative edge of the master clk. When the look signal is activated or logic-0, the synchronized look signal swaps the switch SJMP to pump charge from VAA to Vout and simultaneously holds the counter 802. Introduced charge pulls up the node Vout to k-steps ahead. During activation of the look signal, if the jumpb signal changes from logic-0 to 1, the counter is incremented (e.g., by 16-LSB). Upon deactivation of the look signal, the CJump is removed and the k-steps introduced by CJump are compensated by an increment in counter or capacitor bank (e.g., 16-LSB). Until the next activation of the look signal, the ramp generator ramps with discrete steps. Upon deactivation of the look signal SJMP is changed to dump introduced charge or k-step to GND and the ramp signal falls back k-steps and continues with discrete steps. The value of CJump is chosen such as to compensate the increment in the counter or capacitor bank. The value of CJump can depend on the jump voltage range at Vout during the ramping operation from Vlow to Vhigh.

Figure 10:
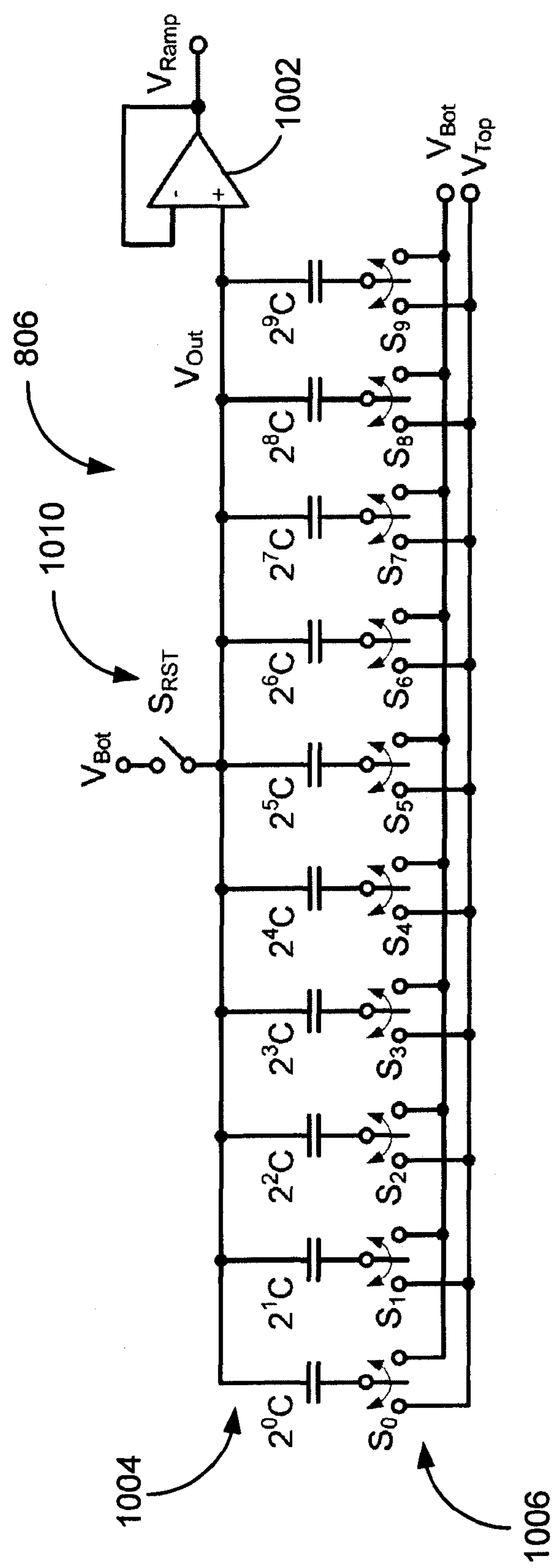
FIG. 10 is a circuit diagram of a capacitor bank that can be used in the ramp generator of FIG. 8.

The illustrated ramp generator in FIG. 10 is for 10-bit version of a digital-to-analog converter, but other bit widths can be used. Likewise, there are a variety of architectures for ramp generators and the present disclosure illustrates only one possible example, but any known ramp generators can readily be used. Turning briefly to FIG. 10, a particular example of a capacitor bank 806 is shown. The capacitor bank 806 includes an analog buffer 1002, an array of binary weighted capacitors 1004, and switches 1006 (S0-S9), which connects the capacitor plates to a certain voltage. The switches (S0-S9) are controlled by the 10-bit digital input corresponding to the least significant bit (LSB) to the most significant bit (MSB). Depending on the switch condition, the bottom plate of capacitor is either connected to VBot or VTop voltage level (which correspond to Vlow and Vhigh).

When switch SRST 1010 is closed, the set of top plates of the binary capacitances are coupled to VBot. When the digital input equals to a logic low, the bottom plate of the capacitors are connected to VBot so that the top and bottom plate of the capacitor are at same potential and the net charge on any capacitor will be zero. When 10-bit digital inputs are incremented, there will be a charge distribution between the two sets of capacitors: CTop and CBot. CTop is the total capacitance between node Vout and VTop node. Similarly, CBot is the equivalent capacitance between node Vout and VBot. This charge distribution results a voltage change on output node as given by equation:

$$V_{Out}=\frac{(V_{Top}-V_{Bot})}{\sum_{i=0}^{n-1}C_i}C_{Top}+V_{Bot}=V_{Step}\cdot C_{Top}+V_{Bot}$$

Voltage on node Vout can be increased in discrete steps (VStep) such as if the digital inputs are increased by 1-LSB at regular time intervals. In order to control the switches or to generate n-bit digital input at regular intervals, the n-bit synchronous counter 802 can be used. The reason for using the synchronous counter 802 is that whenever capacitors are switching between VBot and VTop it involves charge pumping to or from the node Vout. If switching does not take place simultaneously, the output node could have a glitch during the counter increment.

Figure 9:
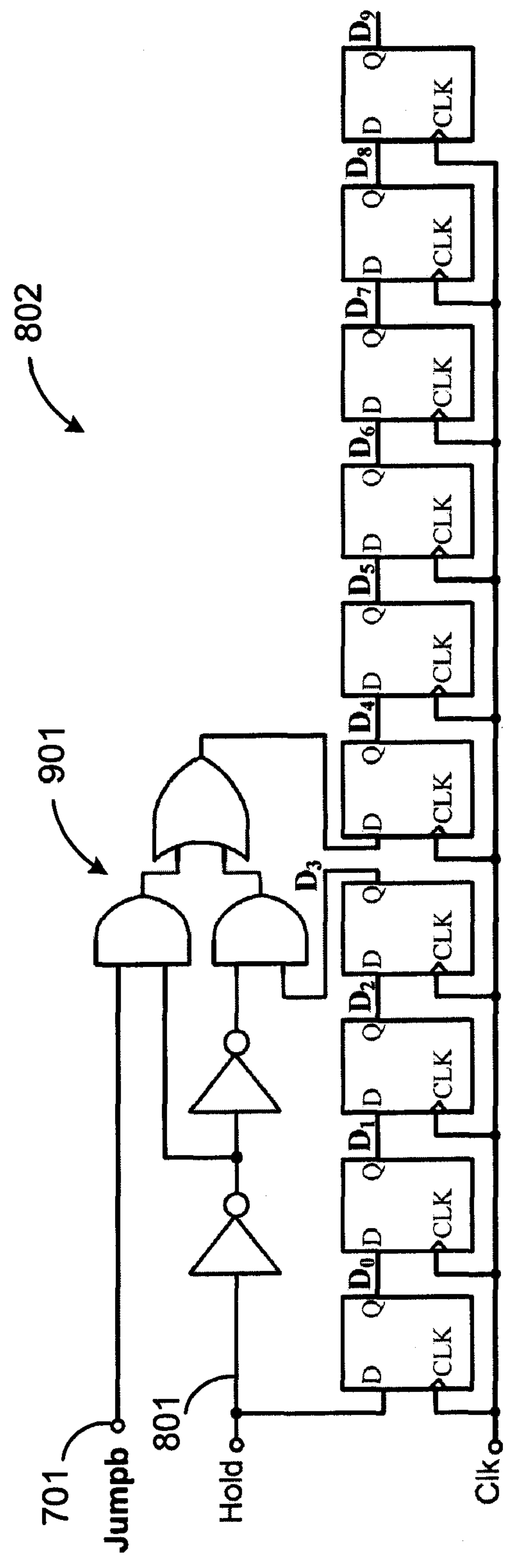
FIG. 9 is a more detailed circuit diagram of a counter with the ability to jump ahead that can be used in the ramp generator of FIG. 8.
Figure 12:
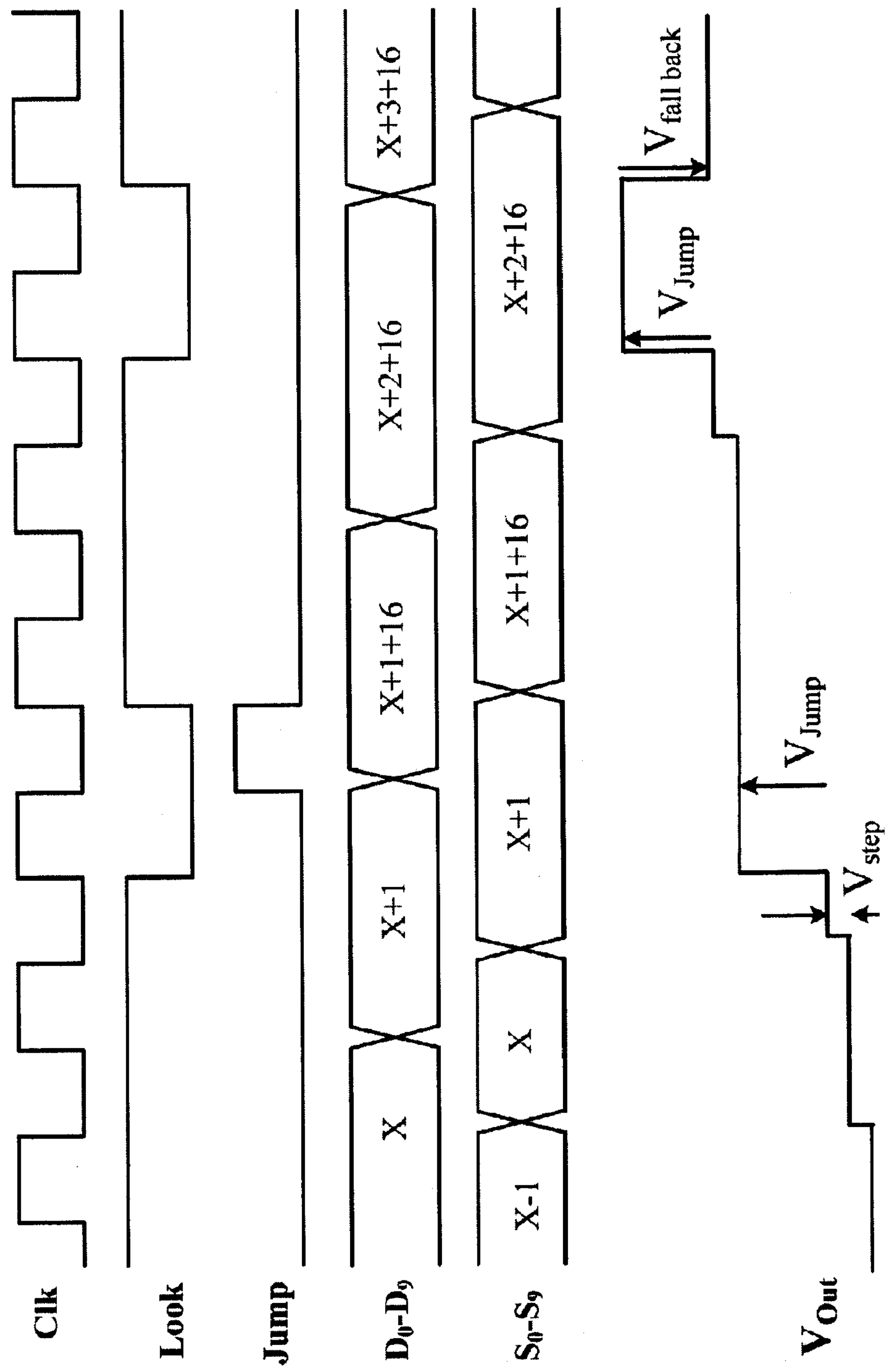
FIG. 12 is a timing diagram that can be used with the ramp generator of FIG. 9.

FIG. 12 shows timing diagrams for the example ramp generator of FIG. 8. As can be seen, the substantially ramped output can be a series of steps (Vsteps) and a jump is more than 1 Vstep. The above explained 10-bit ADC topology can be modified to attain 10-bit ramp signal with look and jump features for SSLAR ADC. There are different ways to achieve the required function. In order to jump and fall back as quick as possible, an additional capacitor CJump can be included. The value of CJump depends on jump voltage range at the Vout during ramping operation from VBot to VTop. To implement the counter, an additional combinational logical circuit 901 can be added to a 10-bit synchronous counter, such as is shown in FIG. 9. There are two signals to control the look and jump functions in 10-bit ramp block. Depending on the jumpb control input 701, the combination logic 901 introduced in the 10-bit counter adds binary weighted numbers to the present value of the 10-bit counter value. For example, when jumpb equals to 0, it does not affect the normal operation of the counter. When jumpb 701 asserted to 1, the combinational logic 901 at the output 4th bit adds 16 to the previous state value. As long as jumpb is asserted, the counter is incremented by 16 during each positive edge of the clock. When hold 801 equals '0', the counter holds four LSB bits and holding or jumping the 16 LSB depends on the jumpb 701 signal. Although a reset signal is not shown in FIG. 9, one skilled in the art can easily add a reset line that will initiate the counter to zero. Additionally, a similar type counter can be used as the counter 540. It will be recognized that any desired counter design can be used, as it is well within one skilled in the art to use any of a variety of counter designs as the counter 540.

Figure 11B:
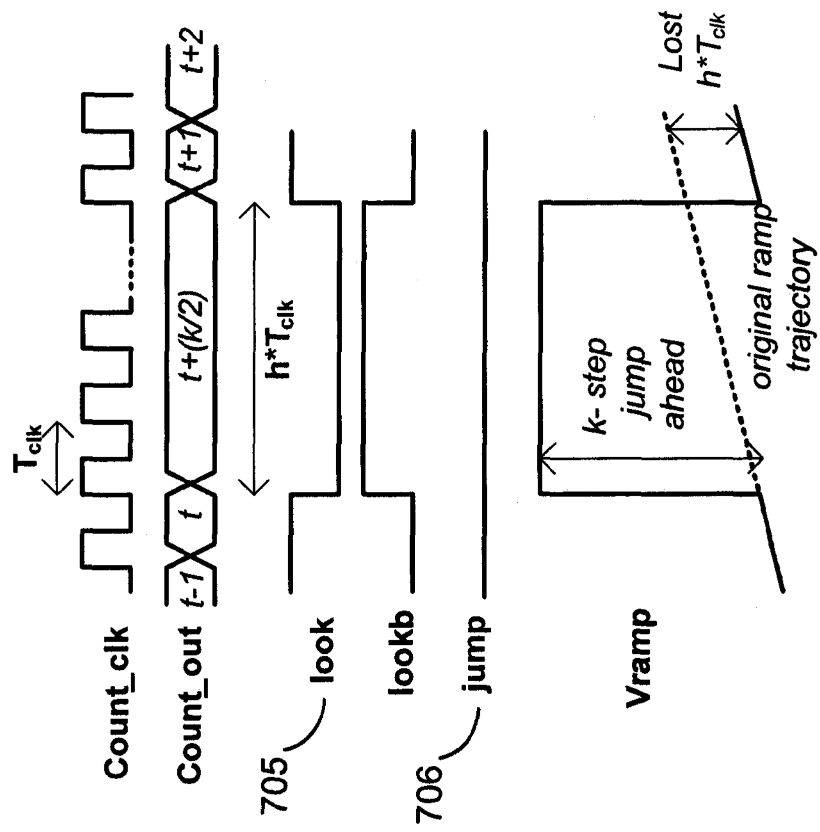
FIGS. 11A and 11B are timing diagrams of the ADC of FIG. 5 with a jump ahead and jump back, respectively.
Figure 11A:
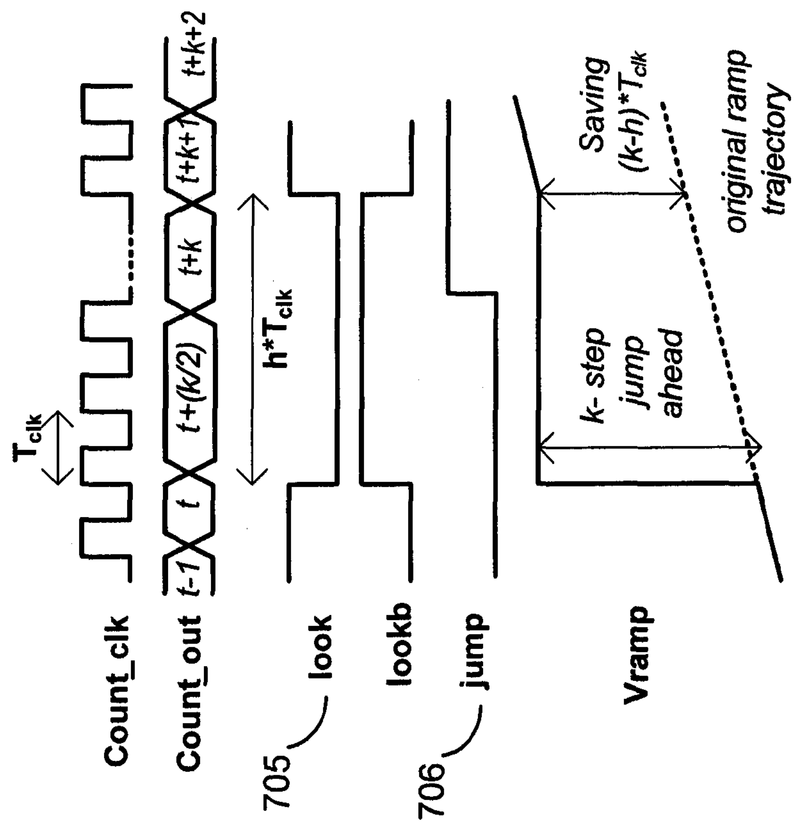

FIGS. 11A and 11B show timing diagrams for the ADC with a look-ahead controller. In non programmable ramp generator case as presented in FIG. 8 and FIG. 9, event detector 700 works as look-ahead controller block 530. The ramp generator 508 can receive two digital control signals from the LAC block: look 705 and jump 706. When the look signal is activated, the ramp output (Vramp) jumps k-steps ahead while counter jumps (k/2)-bits ahead. The k/2 value is chosen for the counter as an average digital value should there not be a jump back. Other values can be chosen as counter jump step. If the jump signal 706 is a logic-1 while the look signal goes from logic-1 to logic-0, then the ramp output continues from jumped analog ramp level. In this case, counter jumps (k/2) bits more to count from k-bits ahead from the pre-jump count value (t) (see FIG. 11A). If the jump signal is logic-0 while the look signal going from logic-1 to logic-0, then the ramp output falls back k-steps to the original level before look operation. In this case, counter also jumps (k/2) bits back to count from the pre-jump count value (t) as seen in FIG. 11B.

In the case where all column voltage values (Vin[1-m] ~Vx) are in one k-step range of the ADC input, conversion time of an n-bit SSLAR ADC is given by the following equation:

$$T_{con,SSLAR,best}=\left(\left(\frac{2^n}{k}\right)\cdot h+k\right)\times T_{clk}$$

h in this equation is the number of clock (Tclk) cycles spend during look-ahead operation while look signal 705 is low. In the case where column voltages exist in all gray levels of the ADC range, conversion time of n-bit SSLAR ADC is given by the following equation:

$$T_{con,SSLAR,worst}=\left(\frac{2^n}{k}\right)\cdot(h+k)\times T_{clk}$$

Conversion time of standard single slope ramp (SSR) ADC is independent from and condition and is given with the following equation:

$$T_{con,SSR}=2^n\times T_{clk}$$

Thus analog-to-digital conversion speed-up (Sup) and slow-down (Sdown) ratios for n-bit resolution can be found in for best and worst cases with the following equations:

$$S_{up}=\frac{T_{con,SSR}}{T_{con,SSLAR,best}}=\frac{2^n}{\left(\frac{2^n}{k}\right)\cdot h+k}$$

$$S_{down}=\frac{T_{con,SSR}}{T_{con,SSLAR,worst}}=\frac{2^n}{\left(\frac{2^n}{k}\right)\cdot(h+k)}$$

If it is assumed that half of the columns are within the k-step range and the other half not, then the speed-up ratio could follow the following equation:

$$T_{con,SSLAR,nom}=\left(\left(\frac{2^{n-1}}{k}\right)\cdot(h+k)\right)\times T_{clk}$$

$$S_{up}=\frac{T_{con,SSR}}{T_{con,SSLAR,nom}}=\frac{2\cdot k}{(h+k)}$$

Thus proposed SSLAR-ADC architecture provides 78% (or 1.78 times) analog to digital speed improvement in nominal case for k=16, n=10, and h=2 over the standard SSR ADC architecture. This improvement becomes 7.11 times in best case scenario for the same n, k, and h values.

Figure 13:
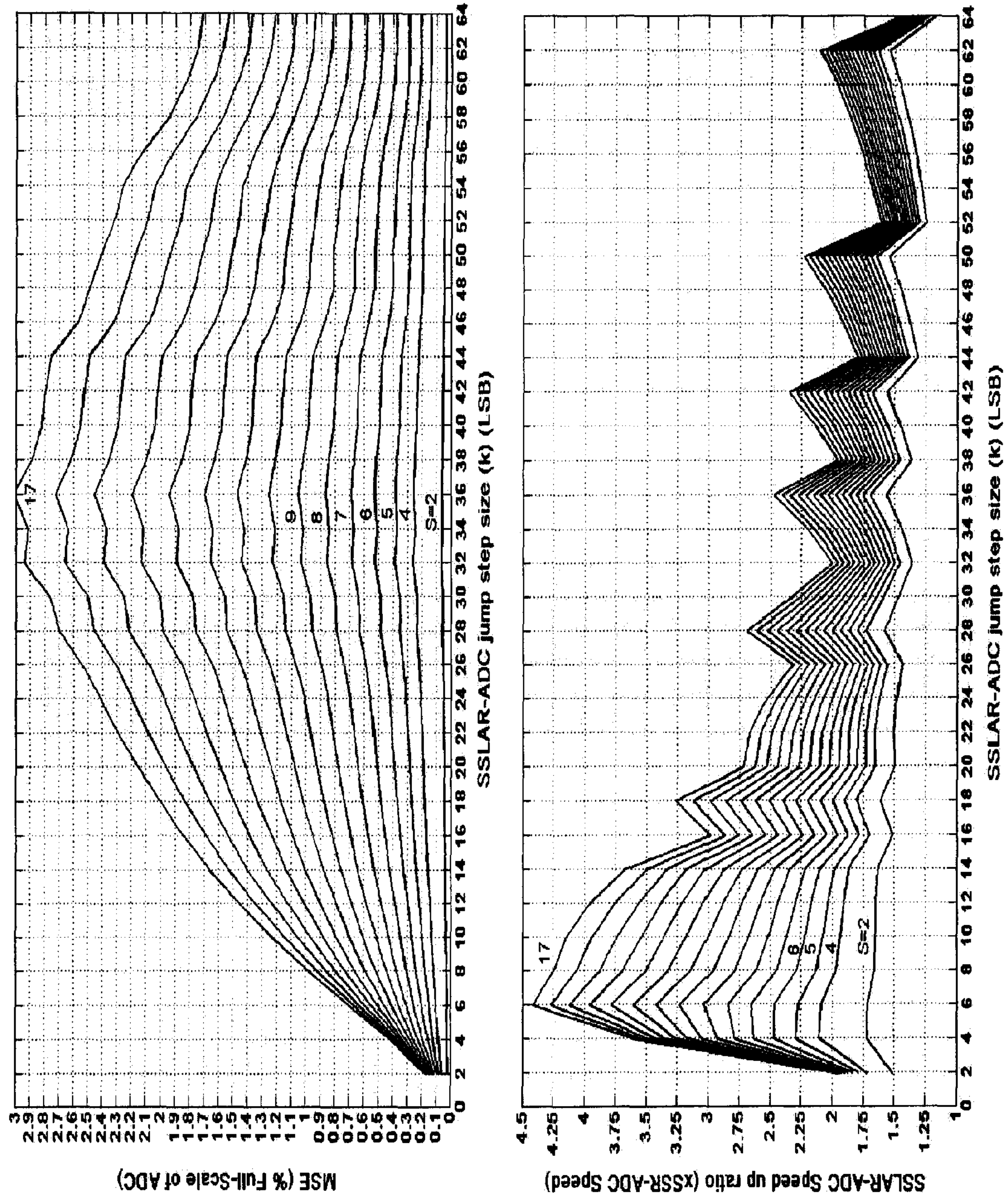
FIG. 13 shows different graphical representations of mean-square errors and speed-up ratios depending on the jump size and threshold values used for jumping.

FIG. 13 includes two graphs showing Mean Square Error (MSE) versus the jump step size for varying threshold levels (S) and speed-up ratio versus the jump step size. As expected, larger threshold introduces greater error, but faster speed-up. As can be seen, step sizes between 2 and 64 were tested with increments by 2. Additionally, the thresholds varied between 2 and 17. Other step sizes and thresholds can be used.

FIG. 14 is a flowchart of a method for converting analog to digital. In process block 1400, a voltage is ramped at a substantially constant rate. A substantially constant rate can be with discrete steps, as illustrated in FIG. 12 or with a continuous slope, as illustrated in FIG. 11. In process block 1402, a look-ahead jump step is performed so that the voltage jump steps more than at the constant rate. For example, if the substantially constant rate has a discrete step of 1 unit, then the jump is a k-step increment, where k is greater than 1. The example jump or look ahead range is between a first voltage level and a second voltage level. In process block 1404, a detection is made of the number of analog signals that were in the look ahead range. Thus, as a result of the jump step, a number of the comparators 504 immediately switch states locking the count k/2 in the latches 550. In this way, the look-ahead controller dynamically tests voltage levels on the comparator outputs to determine if the error rates would exceed a desired threshold number. The predictor circuits 520 can sense the number of comparators that changed state through detection of the voltage levels on the comparators and supply such information to the event detector 700 located in the look-ahead controller 530. In decision block 1406, if the number detected is below a threshold then in process block 1408, the ramp is maintained at the substantially constant rate from the second voltage level. If the number detected is above a threshold number, then too many pixels are affected by the jump step and the ramp voltage is decreased back to the first voltage level (process block 1410) so that it can continue along at its original trajectory (e.g., 1 step at a time).

Figure 15:
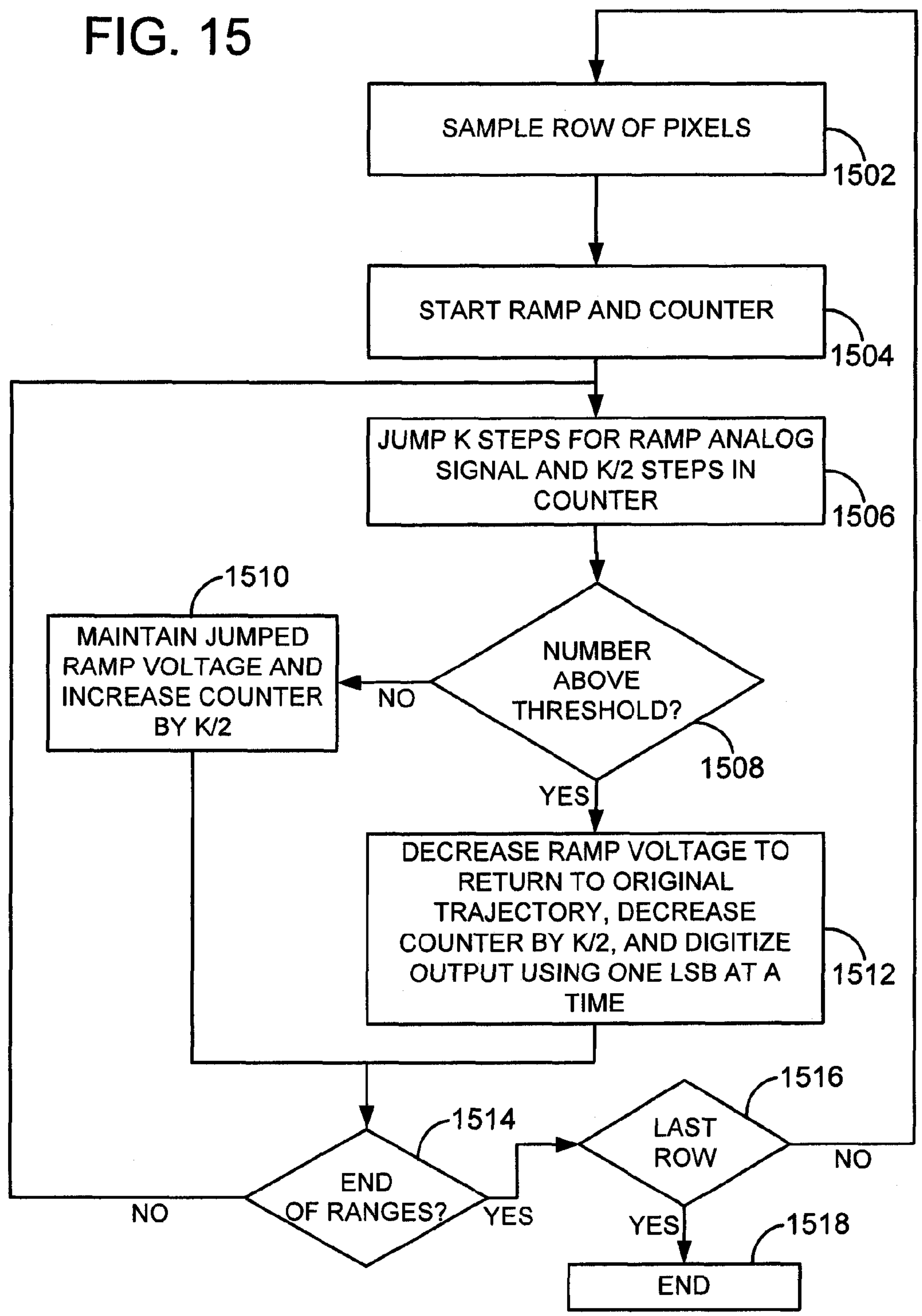
FIG. 15 is a flowchart of a method providing additional details that can be used in the flowchart of FIG. 14.

FIG. 15 is a flowchart of a method showing additional details to the flowchart of FIG. 14. In process block 1502 a row of pixels is sampled in a pixel array, such as in a CMOS image sensor. In process block 1504, a ramp generator and counter are reset and started. In process block 1506, the ramp generator has a k-step jump and the counter is incremented k/2. Thus, instead of a typical ramp of one step, the k-step jump is more typically a jump of 2 or more steps (typical example steps are 5, 6, 7 . . . $2^n$). In decision block 1508, a check is made to determine if the number of comparators 504 change state are above a threshold number. If not, the k-step jump is maintained and the ramped voltage continues from the jumped to location (process block 1510). Additionally, the counter is incremented an additional k/2 steps to synchronize it with the ramp generator. If decision block 1508 is answered in the positive, then the ramp voltage is decreased by k steps back to its original value and trajectory (process block 1512). Additionally, the counter is decremented by k/2 to synchronize it with the ramp generator. At decision block 1514, a check is made to determine if all of the ranges have been completed. If not, then the process loops back to process block 1506 and continues. If process block 1514 is answered in the positive, then a check is made in decision block 1516 whether this is the last row in a frame to convert into digital. For example, there may be additional row of pixels to convert. If yes, then the process ends (process block 1518), but, if not, then the process starts over again at process block 1502.

Figure 16:
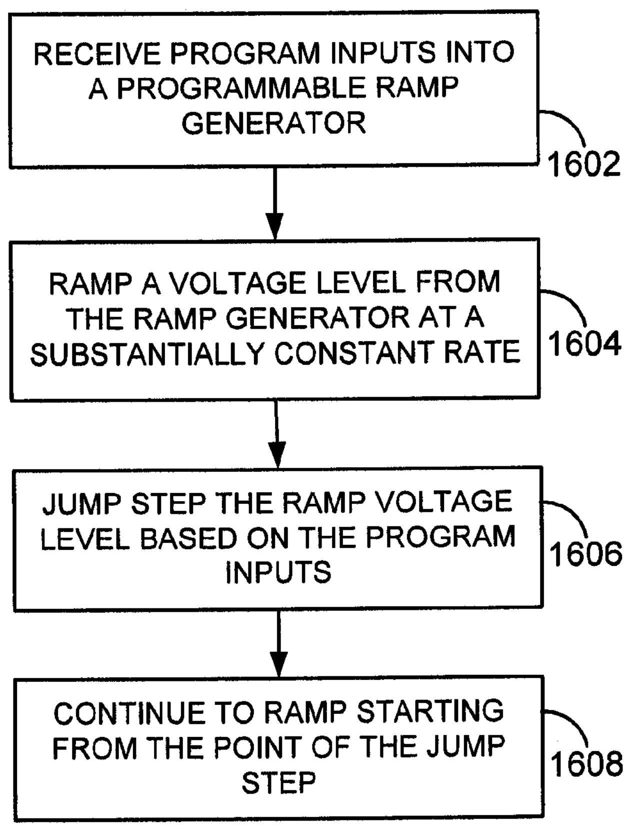
FIG. 16 is a flowchart of a method for programmatically modifying a ramp generator.

FIG. 16 is a flowchart of a method for programmatically modifying a jump step voltage in a ramp generator. Such a modification results in dynamically changing the speed of the conversion from analog to digital. Additionally, the programming can be accomplished through user input using an input port to the ADC. In process block 1602, program inputs are received into a programmable ramp generator. The program inputs are generally supplied to input pins on the ADC by a user. In process block 1604, the ramp generator ramps up a voltage level at a substantially constant rate, such as by using predetermined voltage steps for a predetermined period of time. In process block 1606, the ramp voltage level is jumped based on the program inputs. For example, an amount of the jump step can be directly dependent on a value of the program inputs, such that changing the program inputs changes an amount (in volts) of the jump step. In process block 1608, the ramp continues from the point of the jump step. Thus, by using a jump step, the ramped output voltage transitions from a ramp voltage having a first trajectory to a ramp voltage having a second trajectory. Although not shown in FIG. 16, after the jump step, if it is determined that too many comparator circuits changed state, a jump back can occur. Otherwise, the jump step is maintained from the second trajectory.

Figure 31:
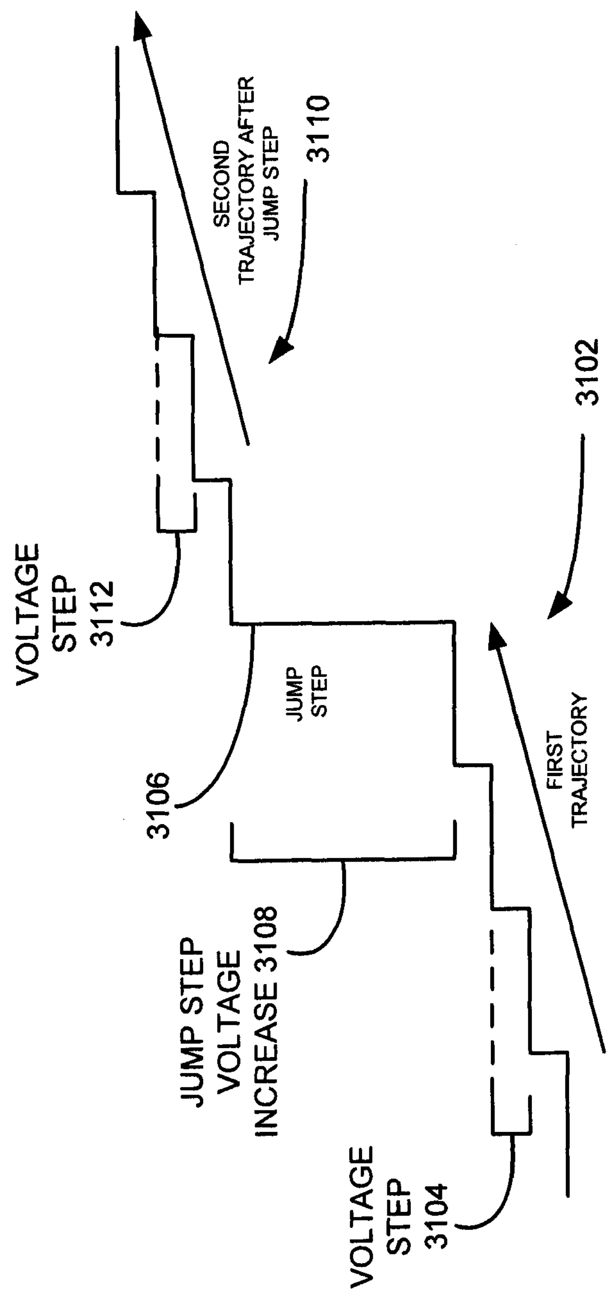
FIG. 31 is a substantially ramped output voltage having a first trajectory.

Turning briefly to FIG. 31, a substantially ramped output voltage having a first trajectory is shown at 3102. As can readily be seen, the substantially ramped output voltage is made of a series of voltage steps, such as shown at 3104. The voltage steps are a predetermined voltage differential from the previous voltage level and are for a predetermined period of time. Alternatively, the substantially ramped output voltage can be a smooth and continuous ramp, instead of voltage steps. A jump step is shown at 3106. The jump step is at least twice as large as the voltage steps, but can be any desired increase in voltage. In the illustrated example, the jump step has a voltage increase 3108 that is about five times larger than the voltage steps. Typical jump steps can be anywhere from 0 to $2^{P-1}$ times larger than the voltage steps, where 0 represents stopping the ramp operation and 1 represents incrementing ramp voltage one step at a time. In the illustrated embodiment, programming (P) allows for anywhere from 0 and 127 times larger. After the jump step, the substantially ramped output voltage increases to a second trajectory 3110, different than the first trajectory, although after the jump step, the rate of increase can be equal to the first trajectory. In another embodiment, the step size of the second trajectory can also be programmed to be different than the step size of first trajectory. Thus, a voltage step 3112 can be sized differently than the program step 3104 based on a user's programming input. The jump step voltage increase 3108 is also programmable so that it can be changed dynamically, during the operation of the ADC.

Figure 17:
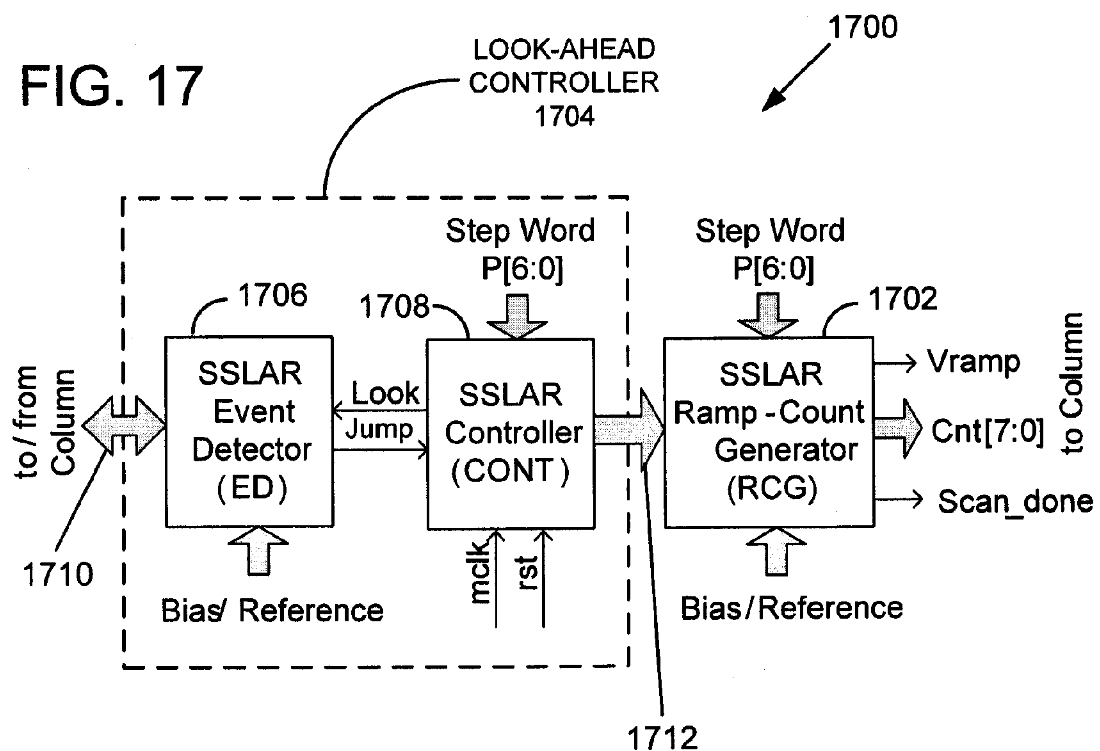
FIG. 17 is an embodiment of a programmable controller and ramp generator.

FIG. 17 shows an example embodiment of an ADC 1700 with a programmable ramp-count generator (RCG) 1702. In this embodiment, the RCG generates a counter output CNT [7:0] 507, and a ramp output Vramp 506. A look-ahead controller 1704 includes an event detector 1706 and a controller 1708. As described further below, the event detector 1706 is similar or identical to the circuitry shown in FIG. 7 and generates a jump signal (similar to signal 706) based on reading voltage levels of the predictor circuits 520 through Vpred signal line 532. Additionally, the event detector 1706 can receive the look signal from the controller 1708. The controller 1708 can include the intelligence and algorithm needed to control the ramp-count generator 1702. Most notably, a programmable input is provided (shown as Step Word P[6:0]) that allows dynamic modification of a jump step voltage increase during operation of the ADC. Thus, a look-ahead step size can be programmable between, for example, 0 and 127 LSB, in this embodiment. The signal lines shown as "to/from column" 1710 coupled to the event detector 1706 are from the predictor circuits (Vpred) in FIG. 5. The event detector 1706 generates a jump signal sent to the controller 1708 and receives a look signal generated by the controller 1708. The controller 1708 can execute a finite state machine that controls the ramp-count generator 1702. The Step Word input is shown as 7 bits, but it can be any desired length needed for programmatically changing the jump step voltage increase within a desired range. The signals 1712 are control signals for operation of the ramp-count generator 1702, as further described below.

Figure 18:
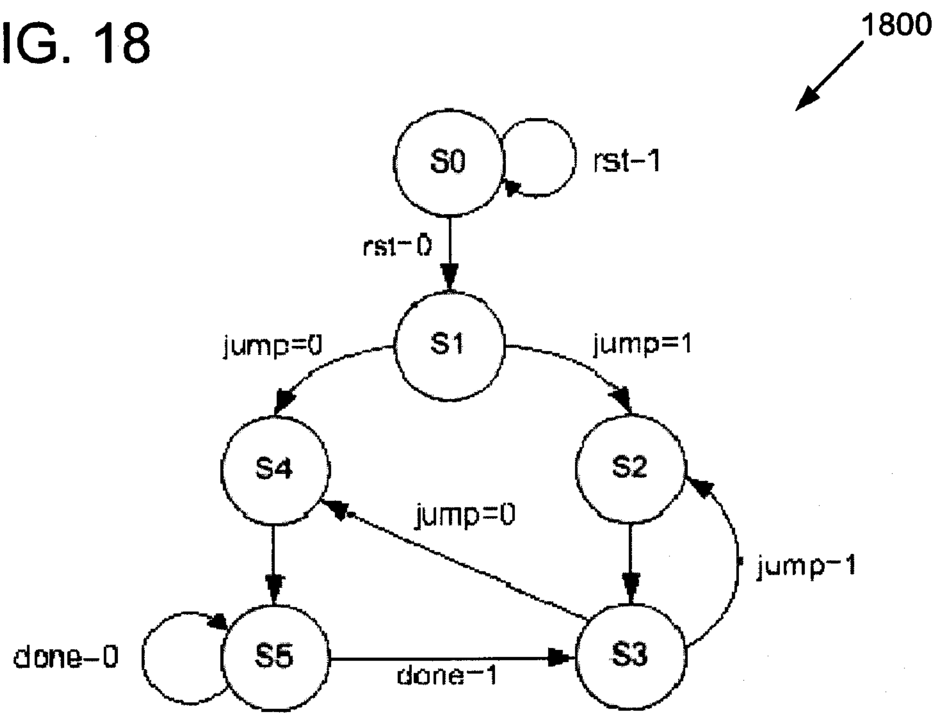
FIG. 18 is an embodiment of a state machine for the programmable controller.

FIG. 18 shows an embodiment of a state machine 1800 that represents a possible algorithm that can be used by the controller 1708. At each state, different control signals are generated for the ramp-count generator 1702 and event detector 1706 as shown in the Table 1, below. An example next state diagram of the state machine is shown in Table 2. The next state diagram can be used for synthesizing the state machine using rising edge triggered D-type flip-flops (DFF). DFF is preferred due to the fact that the next state is depending on the data (D) input of the flip flop, and does not require alteration of the next states during synthesis. However, other designs can be used, such as based off falling edges, or using other types of flip-flops.

In the particular exemplary state machine, three flip-flops were used, since the state machine has less than eight states. The state machine has six operation states to generate six different control signals (listed in Table 1). Some of the signals are used directly by the event detector 1706 and ramp-count generator 1702 (Look, Cnt[2:0]), while others are used internally to generate other control signals.

TABLE 1

| State assigned output signals | | | | | | | | | | |
|---|---|---|---|---|---|---|---|---|---|---|
| State | q2 | q1 | q0 | Look | Cnt0 | Cnt1 | Cnt2 | Latch | C__en | rst |
| Sx | X | X | X | 1 | 0 | 1 | 0 | 0 | 0 | 1 |
| S0 | 0 | 0 | 0 | 1 | 0 | 1 | 0 | 0 | 0 | 0 |
| S1 | 0 | 0 | 1 | 0 | 1 | 0 | 1 | 0 | 0 | 0 |
| S2 | 0 | 1 | 0 | 1 | 1 | 0 | 0 | 0 | 0 | 0 |
| S3 | 0 | 1 | 1 | 0 | 1 | 0 | 1 | 1 | 0 | 0 |
| S4 | 1 | 0 | 0 | 1 | 0 | 0 | 0 | 0 | 0 | 0 |
| S5 | 1 | 0 | 1 | 1 | 0 | 1 | 0 | 0 | 1 | 0 |
| S6 | 1 | 1 | 0 | x | x | x | x | x | x | 0 |
| S7 | 1 | 1 | 1 | x | x | x | x | x | x | 0 |

TABLE 2

| Current and next state diagram of the FSM | | | | | | |
|---|---|---|---|---|---|---|
| | | Next States | | | | |
| Current States | | rst = 0<br>jump.done | | | | |
| State | q2 q1 q0 | 00 | 01 | 10 | 11 | rst = 1 |
| S0 | 000 | 001 | 001 | 001 | 001 | 000 |
| S1 | 001 | 100 | 100 | 010 | 010 | 000 |
| S2 | 010 | 011 | 011 | 011 | 011 | 000 |
| S3 | 011 | 100 | 100 | 010 | 010 | 000 |
| S4 | 100 | 101 | 101 | 101 | 101 | 000 |
| S5 | 101 | 101 | 011 | 101 | 011 | 000 |
| S6 | 110 | X | X | X | X | 000 |
| S7 | 111 | X | X | X | X | 000 |

Four control signals determine the finite state machine's (FSM) states: operation reset ("rst"), jump signal from event detector ("jump"), internal counter done signal ("done"), and master clock signal ("mclk"). If the rst=1, state machine stays at S0 state. The FSM changes its state at rising edge of the master clock signal conditionally or unconditionally. Unconditional state changes exist from states S4 to S5 and from S2 to S3. Other state transitions depend on value of the jump, done and reset signals. If the reset is set high, the state machine goes to state S0 and waits until the reset signal is cleared to move to state S1. The Done signal is generated internally by a synchronous counter and a comparator unit, as shown in FIG. 20.

Figure 19:
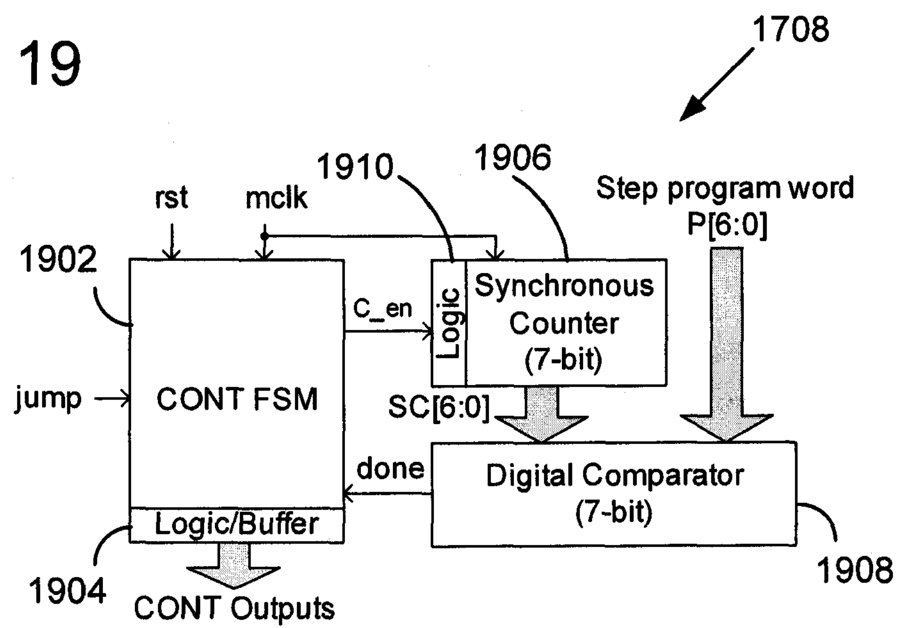
FIG. 19 is a block diagram of a programmable controller.

FIG. 19 shows the controller 1708 in greater detail. The controller generates unique control signals to manipulate the ramp-count generator 1702 and implement the ADC algorithm. The controller 1708 includes a portion 1902 that represents the FSM used for generating the control pulses provided to the ramp-count generator 1702, event detector 1706, and logic 1904 that receives outputs from the FSM to generate the final control signals, shown as CONT outputs. The controller 1708 also includes a synchronous counter 1906 and a digital comparator 1908. Operation of the counter/comparator combination is enabled by the FSM through counter enable signal (C_en). If C_en=1 then the counter 1906 starts counting while the comparator 1908 checks whether the counter value (SC[6:0]) is equal to the step program word (P[6:0]). If it is equal, it asserts the Done signal to high for the FSM to take action. If the Done signal is asserted high, then the counter 1906 enable signal is de-asserted (C_en=0), and changes the state from S5 to S3. When C_en=0, the synchronous counter is reset to "0000000", it waits for C_en to be asserted high again. Logic attached to the counter is used for gating and delaying certain signals for proper operation.

The comparator 1908 receives the programmable input P[6:0] that allows for dynamic programming of the jump step. The comparator 1908 uses the programmable input to determine when the next jump can occur. For example, if there was a fall back after a jump, the comparator 1908 can determine the number of clock cycles before the ramp has returned to the previous level.

Figure 20:
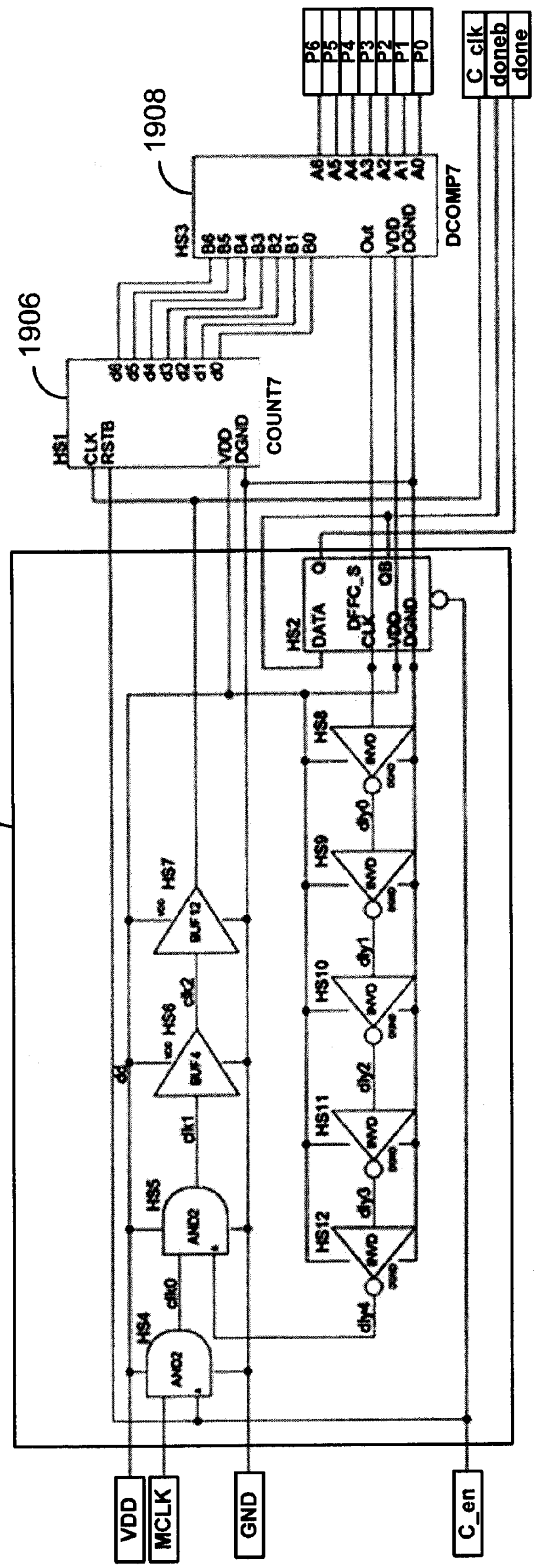
FIG. 20 is a circuit diagram of a counter/comparator/logic block in the controller.
Figure 21:
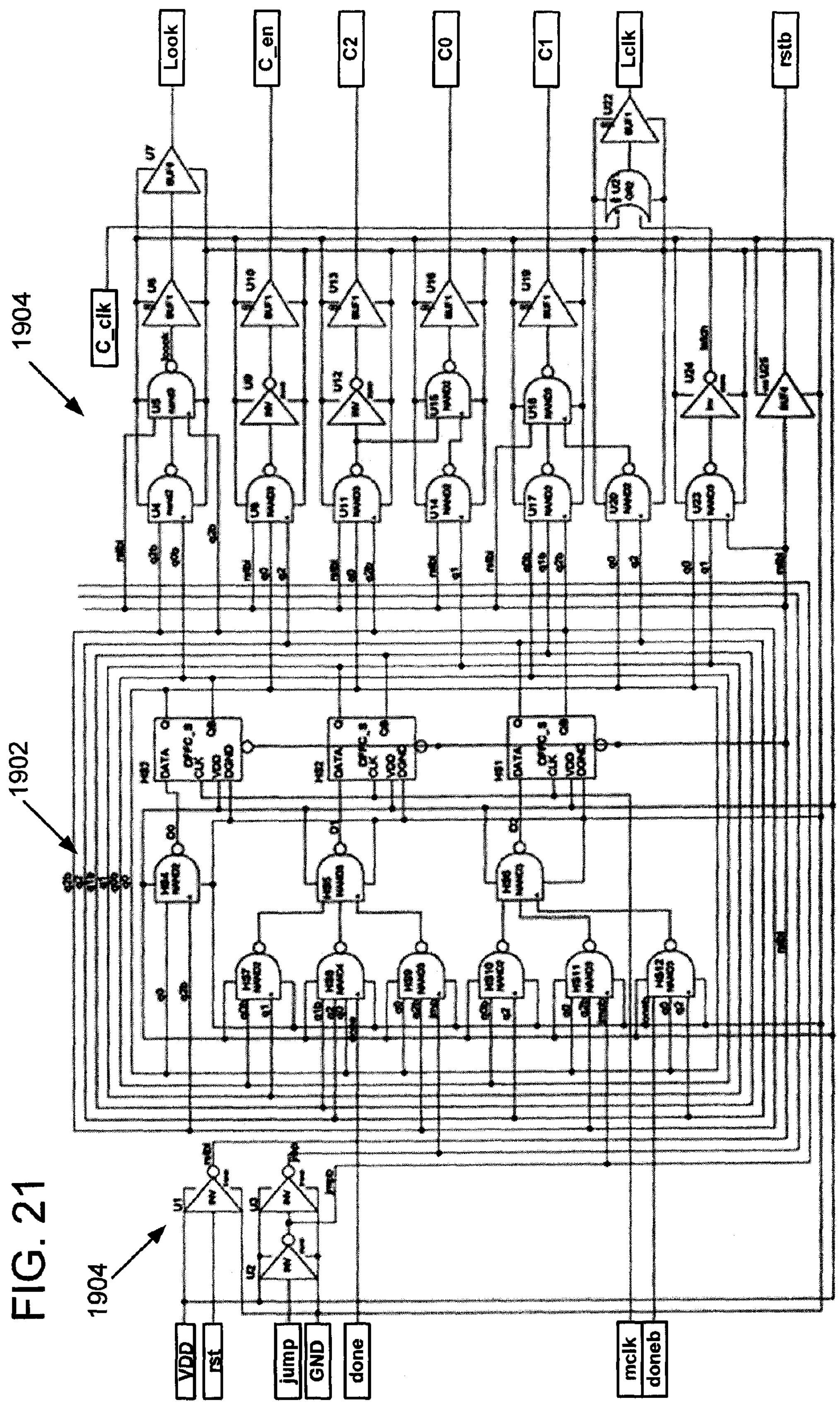
FIG. 21 is a circuit diagram of a finite state machine with logic/buffer elements.

FIG. 20 shows a particular embodiment of the synchronous counter 1906 and the digital comparator 1908. Additionally, logic 1910 is shown. FIG. 21 shows an embodiment of the FSM 1902 and corresponding logic buffer 1904. One skilled in the art will recognize that there are a variety of different designs that can be implemented for the FSM 1902 and logic buffer 1904, and that the disclosed implementation is only a preferred embodiment.

Figure 22A:
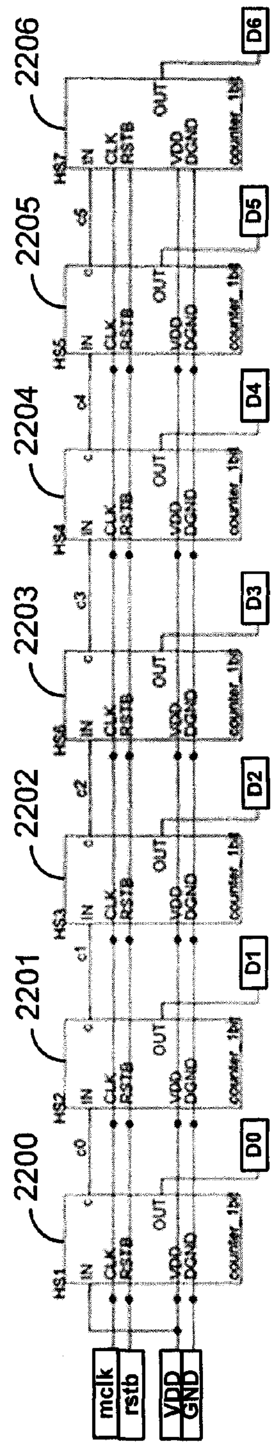
FIGS. 22A, 22B, 22C, and 22D are circuit diagrams of a 7-bit synchronous counter, a one-bit counter slice, a circuit diagram of the XOR gate, and the circuit diagram of an edge triggered D-type flip flop with reset that can be used as the counter of FIG. 20.
Figure 22D:
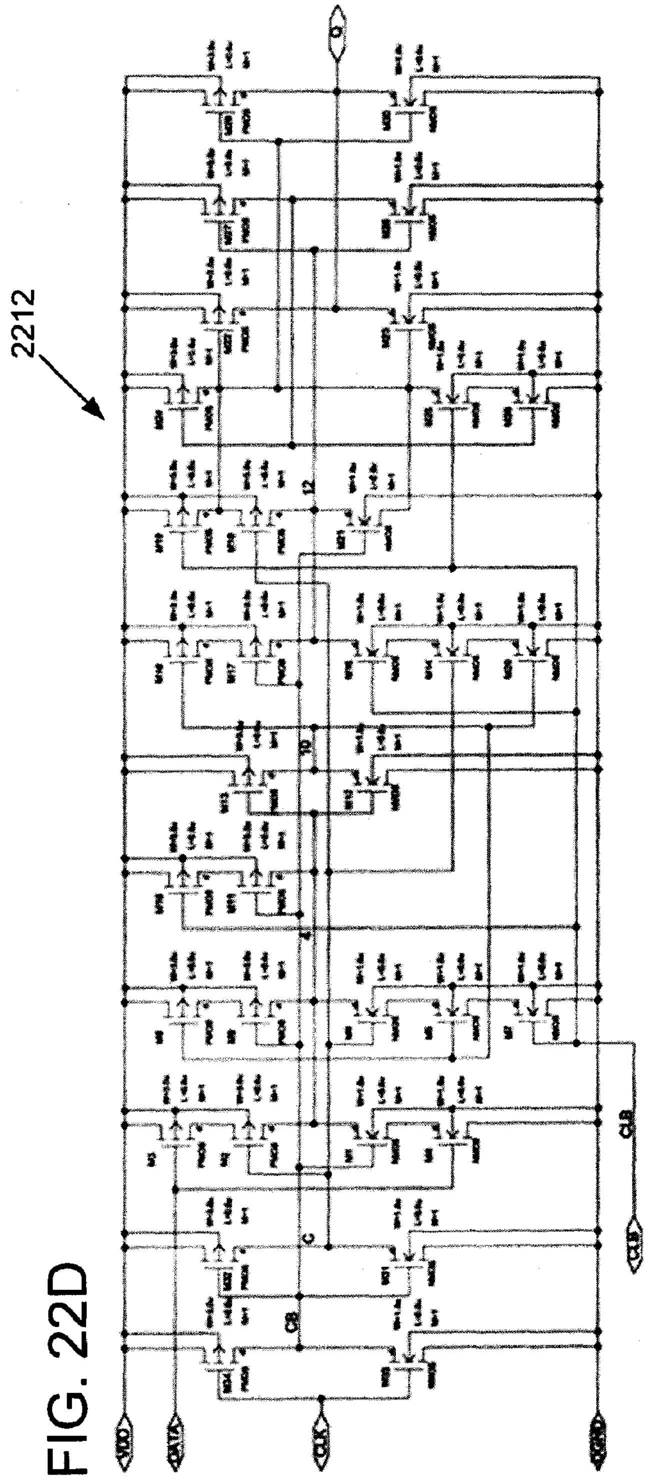
Figure 22B:
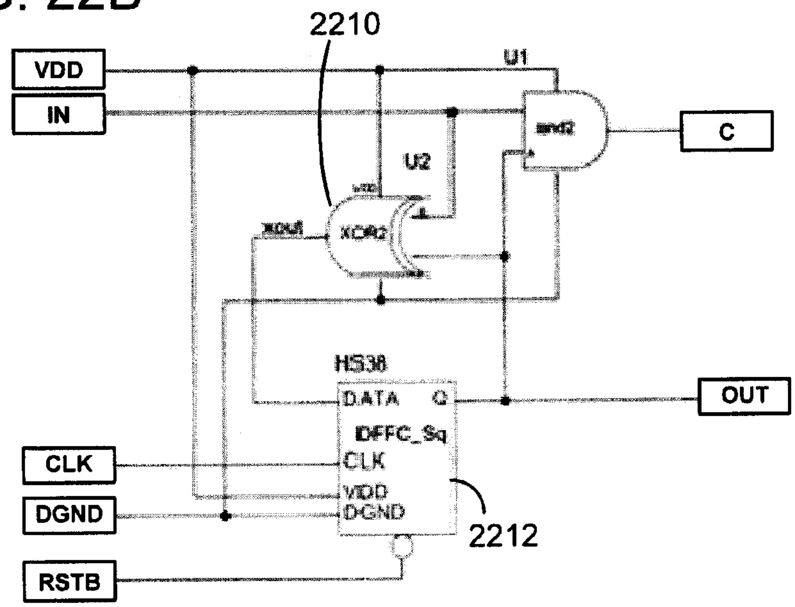
Figure 22C:
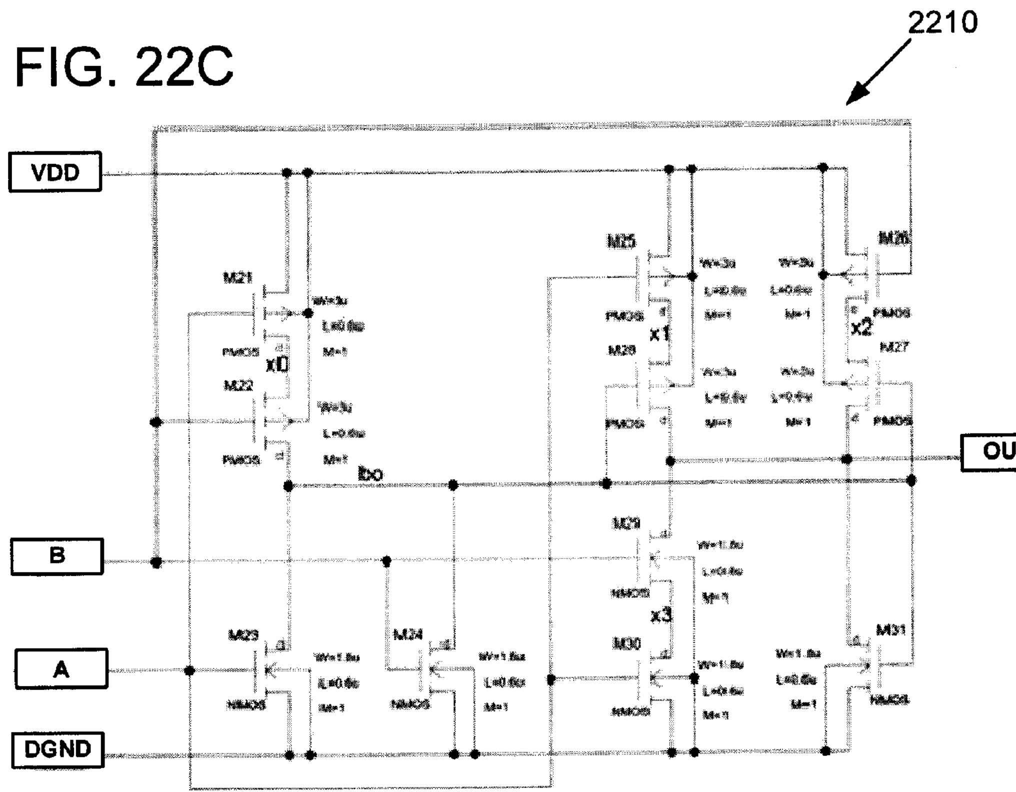
Figure 23:
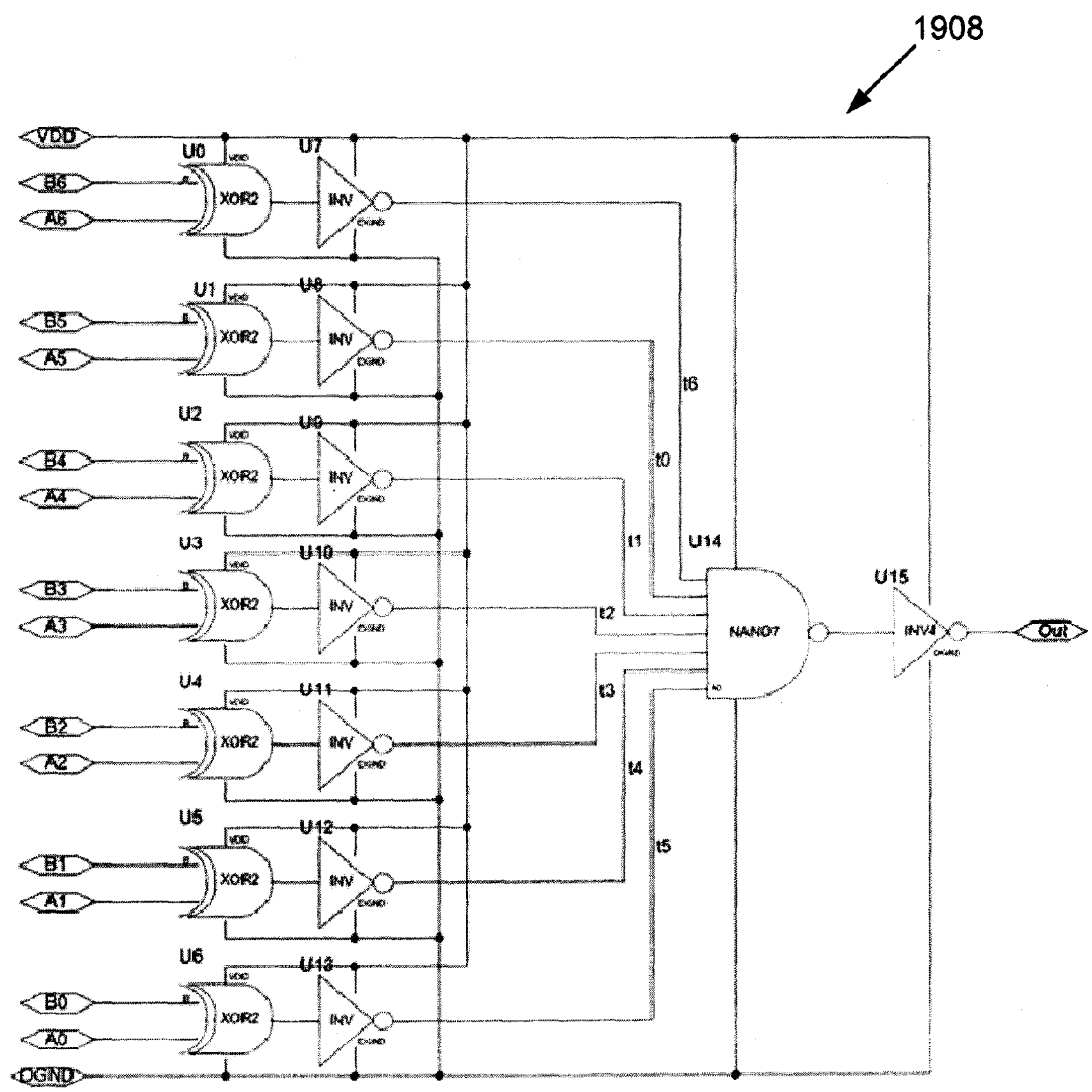
FIG. 23 is a circuit diagram of a 7-bit digital comparator.

FIG. 22A shows a particular embodiment of the counter 1906. As can readily be seen, the counter 1906 includes a series connection of counter sub-blocks 2200-2206 representing a counter slice. FIG. 22B shows an example of one of the sub-blocks 2200 and includes an XOR gate 2210 and a D-type flip-flop 2212. The XOR gate is shown in further detail in FIG. 22C while the D flip-flop 2212 is shown in FIG. 22D. Different implementations of these circuits can be readily substituted. FIG. 23 shows a particular implementation of the comparator circuit 1908. Other comparator circuits can be used.

Figure 24:
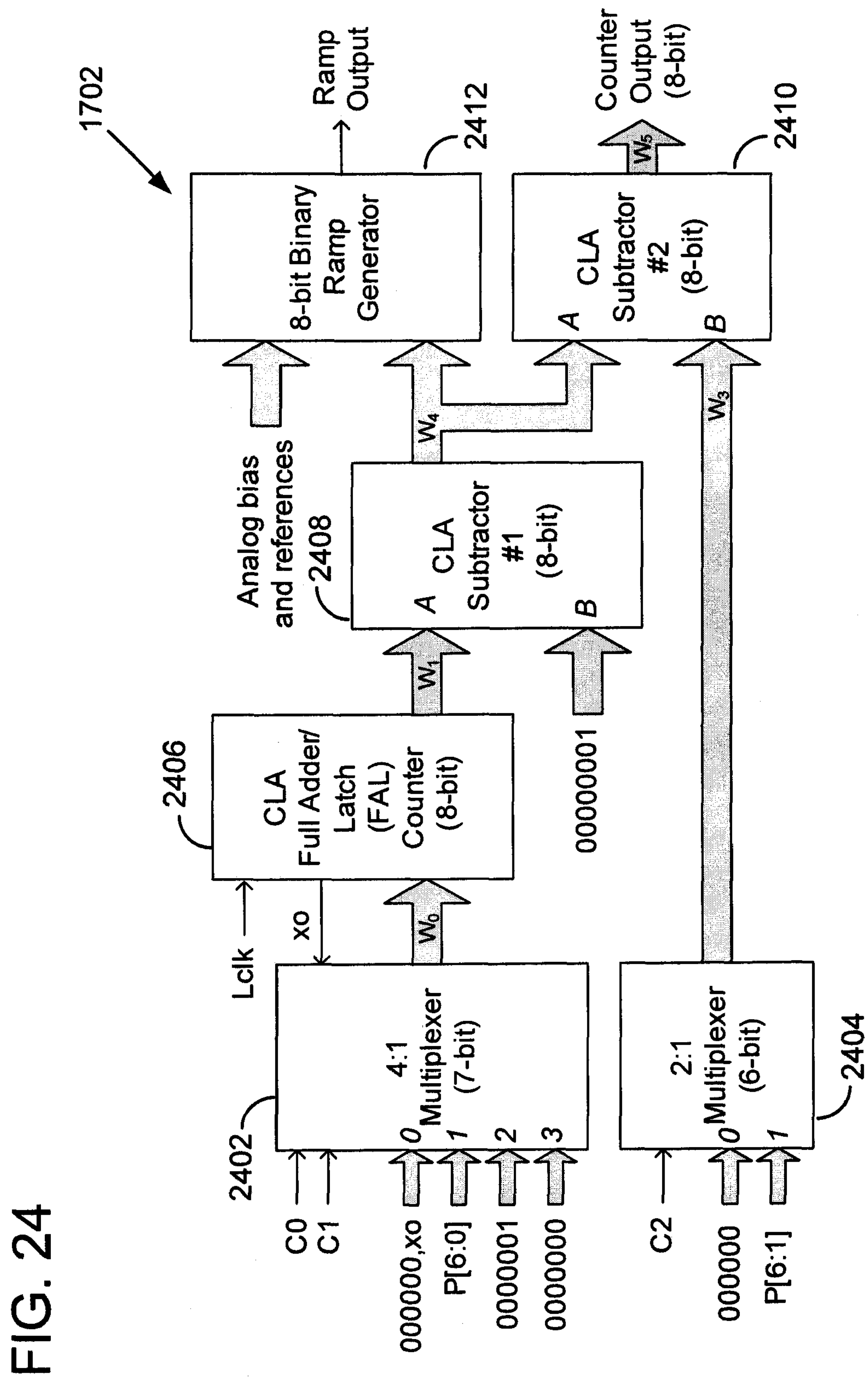
FIG. 24 is a circuit diagram of a programmable ramp generator.

FIG. 24 shows an embodiment of a ramp-count generator 1702. In this embodiment, the ramp-count generator provides a ramped output signal and a counter output. Notably, the counter is implemented with an adder and at least one subtractor instead of typical D flip-flop based circuits. Two multiplexers 2402, 2404 are used to receive the control (CONT) outputs shown in FIG. 19. The C0, C1, C2 lines are the selection lines for each of the multiplexers 2402, 2404. The C0, C1, and C2 signals are shown in Table 1 above (but are labeled as Cnt0, Cnt1, and Cnt2.) Inputs to the multiplexers 2402, 2404, include 000000, xo, wherein xo is a feedback signal provided from an adder 2406, P[6:0], which is the programmable input supplied by a user to program the height of the jump step, and constant values. The adder 2406 is used to create voltage-step increments in the ramp voltage, such as was shown at 3104 in FIG. 31. More particularly, during the typical ramping, a constant value of "0000001" is passed through the multiplexer 2402 to the adder 2406 and increments the adder by a single count (1 voltage step). For a programmable jump step, the P[6:0] input to multiplexer 2402 can be passed to the adder 2406. The increase in the adder count can be anywhere from 2 to 127 times larger than the single count, which results in an increase (a jump step) in the ramp voltage. Subtractors 2408, 2410 can be used for a fall back should the jump step cause too many predictor circuits to change state (see process blocks 1508 and 1516 on FIG. 15). In particular, subtractor 2408 can be used to reduce the count back to its original amount prior to the jump step in order to return the ramp to its original trajectory. Additionally, subtractor 2410 can be used to reduce the counter output back by K/2. The ramp generator 2412 receives the output from subtractor 2408 and generates an output voltage in response thereto. The ramp generator 2412 can be a binary weighted charge scaling ramp generator that generates an analog ramp signal.

In the particular illustrated embodiment, the carry-look ahead subtractor 2408 subtracts "00000001" from the adder outputs (W1). This allows digital bits used by the ramp generator 2412 to be between 0 and 255 for 8-bits.

The 2-to-1 multiplexer 2404 passes the half step programming word if C2='1' or the zero ('0') to the subtractor 2410. It implements the half and full step counter increment operations of the ADC algorithm. Half of the step code word is obtained by taking upper 6 bit of the original step program word as 2-to-1 multiplexer inputs. The FSM was designed such that a half step word is not subtracted from the first subtraction unit outputs (W4) during the first look-ahead operation at which adder outputs (W1) equal to "00000001" and first subtractor output (W4) is "00000000".

One advantage of the programmable ramp generator 1702 is that it uses at least one adder and one or more subtractors to generate the ramp output and the counter output. Typically, such circuits use flip-flops, which are more complex, especially for a programmable ramp generator. Look ahead, jump and fall back operations are controlled through the proper timing of the blocks without having physical counter units in the programmable ramp generator 1702. The only clocked unit is the adder 2406, which allows programmable look-ahead, jump or fall back operations.

Figure 25:
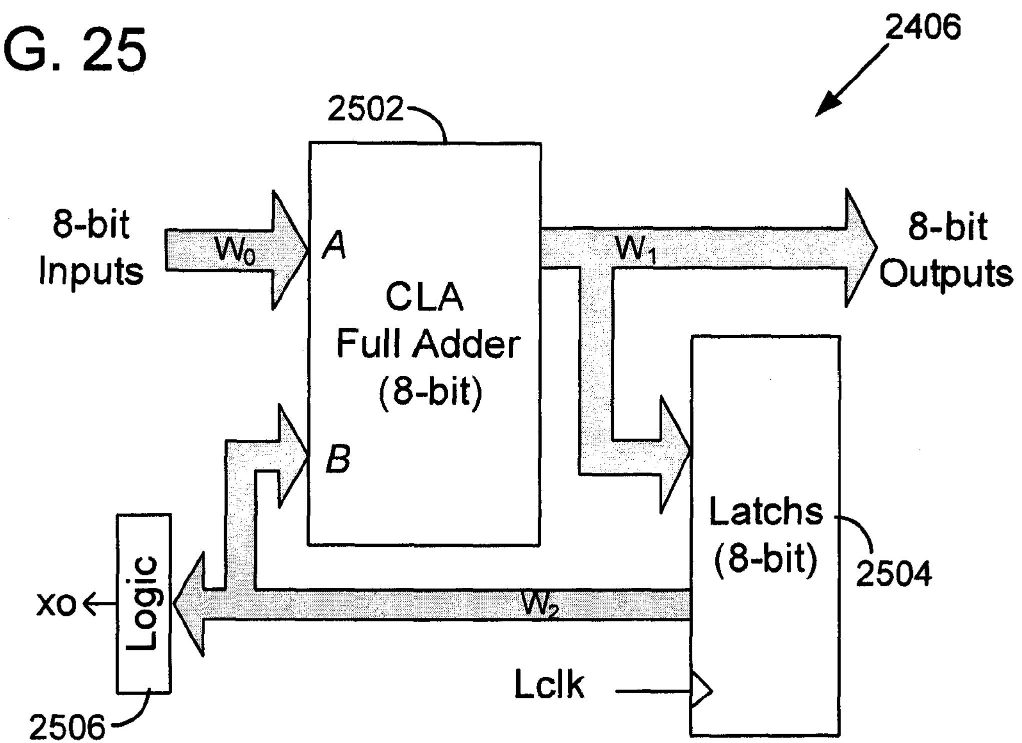
FIG. 25 is a block diagram of a carry-look ahead full-adder and latch unit.

FIG. 25 shows an embodiment of the full adder 2406. The full adder 2406 uses a carry-look-ahead adder 2502 coupled to a latch 2504. The latch stores the current count and provides feedback into the adder 2502 so that the current count can be added to an input signal represented by W0. Logic 2506 is used to generate an xo feedback signal. The xo feedback signal is used to initialize the ramp generator 1702.

In the particular embodiment shown, latch clock (Lclk) is coupled to the latch 2504 and is generated and feed to the latch 2504 from the logic buffer 1904 as one of the CONT outputs. 8-bit inputs (A[7:0]) to the full-adder 2502 are provided by the 4:1 multiplexer unit 2402. Other inputs (B[7:0]) come from the 8-bit latch 2504. The full adder 2502 adds these two inputs and generates the W1 outputs shown in both FIGS. 24 and 25. These W1 outputs are also feed to the 8-bit latch unit 2504. Rising edge triggered D-type flip-flops can be used in the latch unit. When Lclk signal is asserted from low to high, latch block holds the 8-bit outputs of the adder 2502.

Depending on the state of the FSM, one of the four words are passed to adder 2502 from 4-to-1 multiplexer. Multiplexer selection codes (C0, C1) are generated by the controller unit 1708 based on the state of the FSM. When C0='0' and C1='0', digital word equal to zero (0) is passed if xo='0', and one if xo='1'. If the C0='1' and C1='0', then the 7-bit step programming word (N[6:0]) is passed. The digital word equal to one (1) is passed when the selection code equals to C0='0' and C1='1'. Multiplexer input for C0='1' and C1='1' passes a zero (0). As a result, in combination with the 4-to-1 multiplexer outputs, and Lclk signal, the adder 2406 either stops counting for C0='0' and C1='0' or adds '1' if xo='1', or counts n-by-n (N[6:0]=n, i.e. n=5 if N[6:0]="0000101") for C0='1' and C1='0', or counts 1-by-1 for C0='0' and C1='1'.

The logic block in the adder 2406 generates a signal for the FSM unit 1902 for appropriate timing. It can use an 8-input NOR gate to generate "xo" signal.

The CLA-type full adder was used due to the fact that other digital adders, such as the ripple carry adders, produce non-ideal transition of the output values. In a ripple carry adder, the adder output for the LSB bit comes first, while the MSB bit becomes available later after certain delay time. This non-linear delay between adder output bits cause glitches in binary ramp generator (BRG) block. Both the adder and the binary ramp generator work in continuous time domain and any delay among adder outputs would be reflected at the output of the ramp generator. An 8-bit binary weighted capacitive digital-to-analog converter is used as ramp generator, as already described and shown in FIG. 10.

Figure 26A:
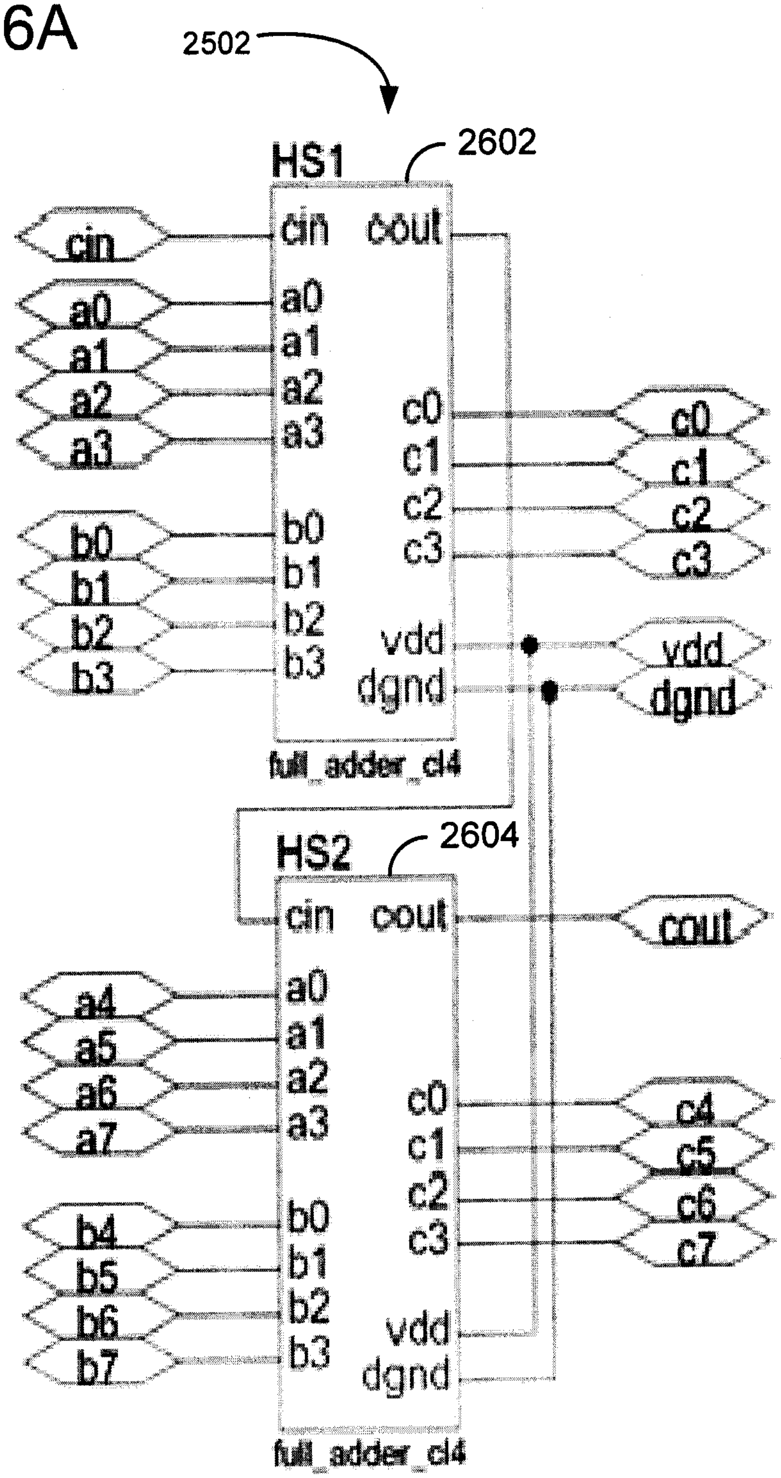
FIGS. 26A and 26B are an exemplary 8-bit carry look-ahead adder and a 4-bit carry look-ahead adder circuit.
Figure 26B:
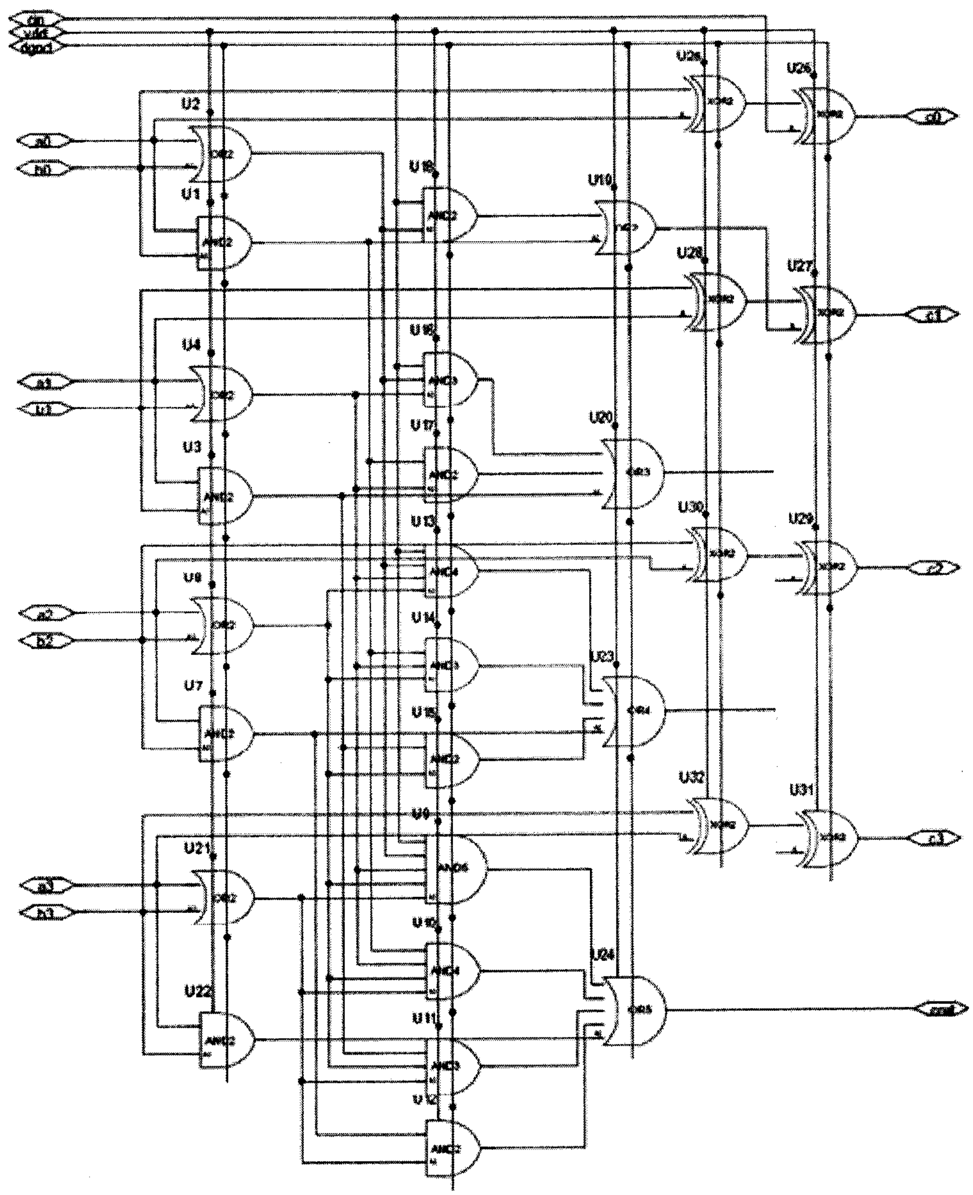

FIG. 26A shows an example of the full adder 2502. In this particular embodiment, the adder 2502 includes two standard 4-bit adders 2602, 2604 coupled in series. Other adder designs can readily be used. FIG. 26B shows an exemplary adder 2602 in greater detail. Other adder designs can be used.

Figure 27A:
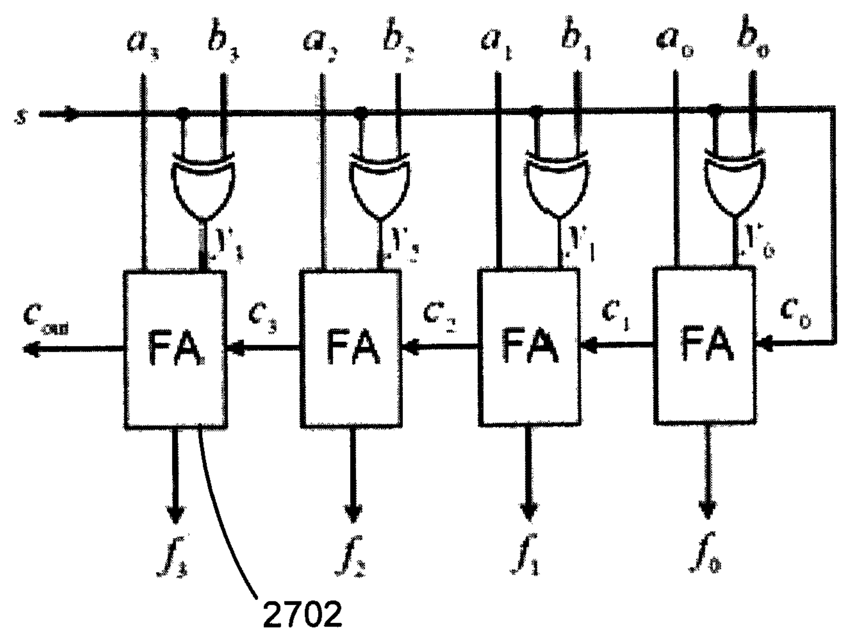
FIGS. 27A and 27B are a 4-bit subtraction unit, a full adder circuit and a full-adder symbol.
Figure 27B:
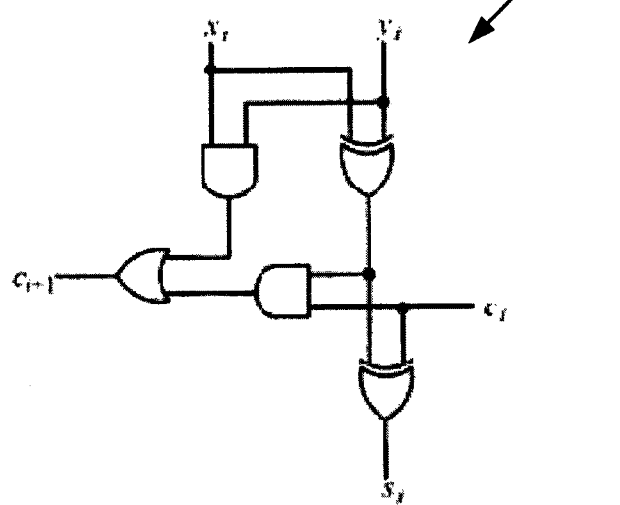
Figure 28:
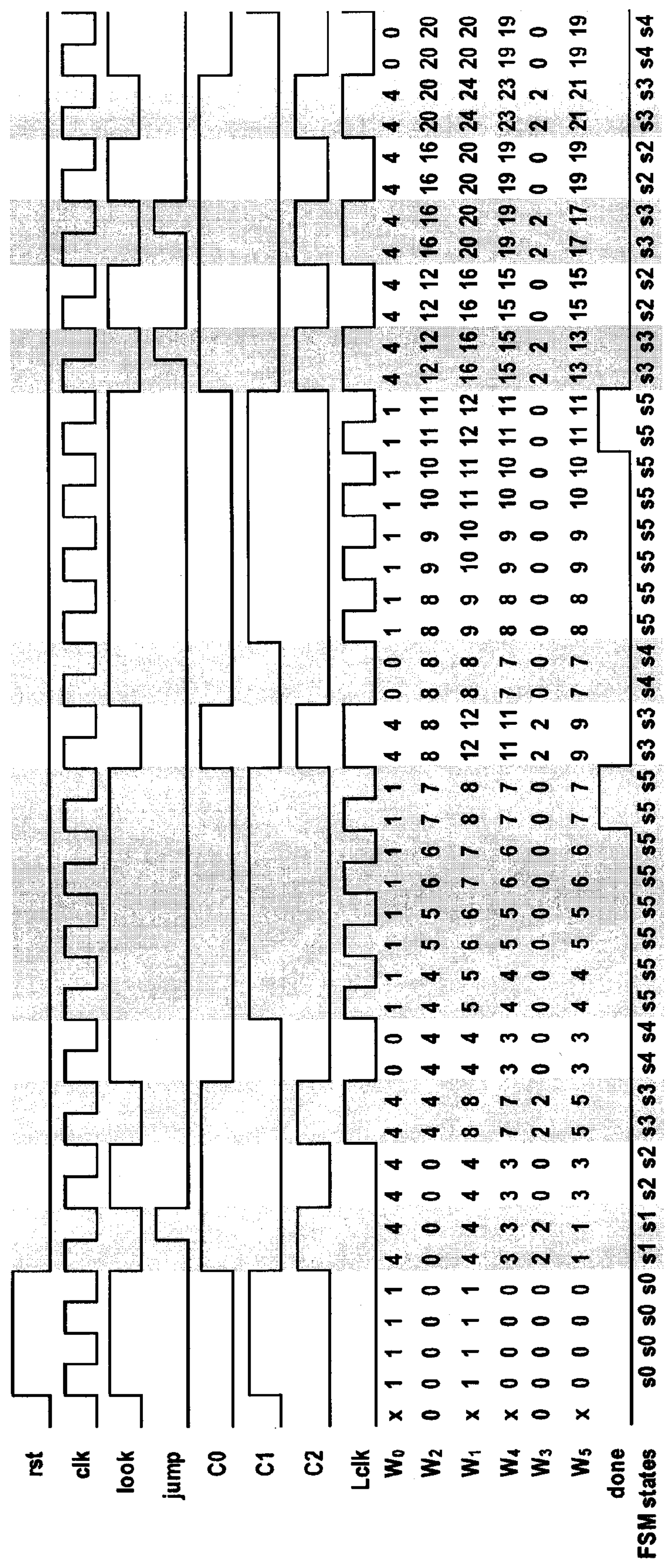
FIG. 28 is a timing diagram showing the timing of the ADC controller and ramp-count unit with a step of 4 LSB.

FIG. 27A shows an exemplary subtractor circuit 2408 and includes a plurality of adder circuits 2702 coupled in series. FIG. 27B shows an example adder 2702. Other adder designs can be used.

Figure 29:
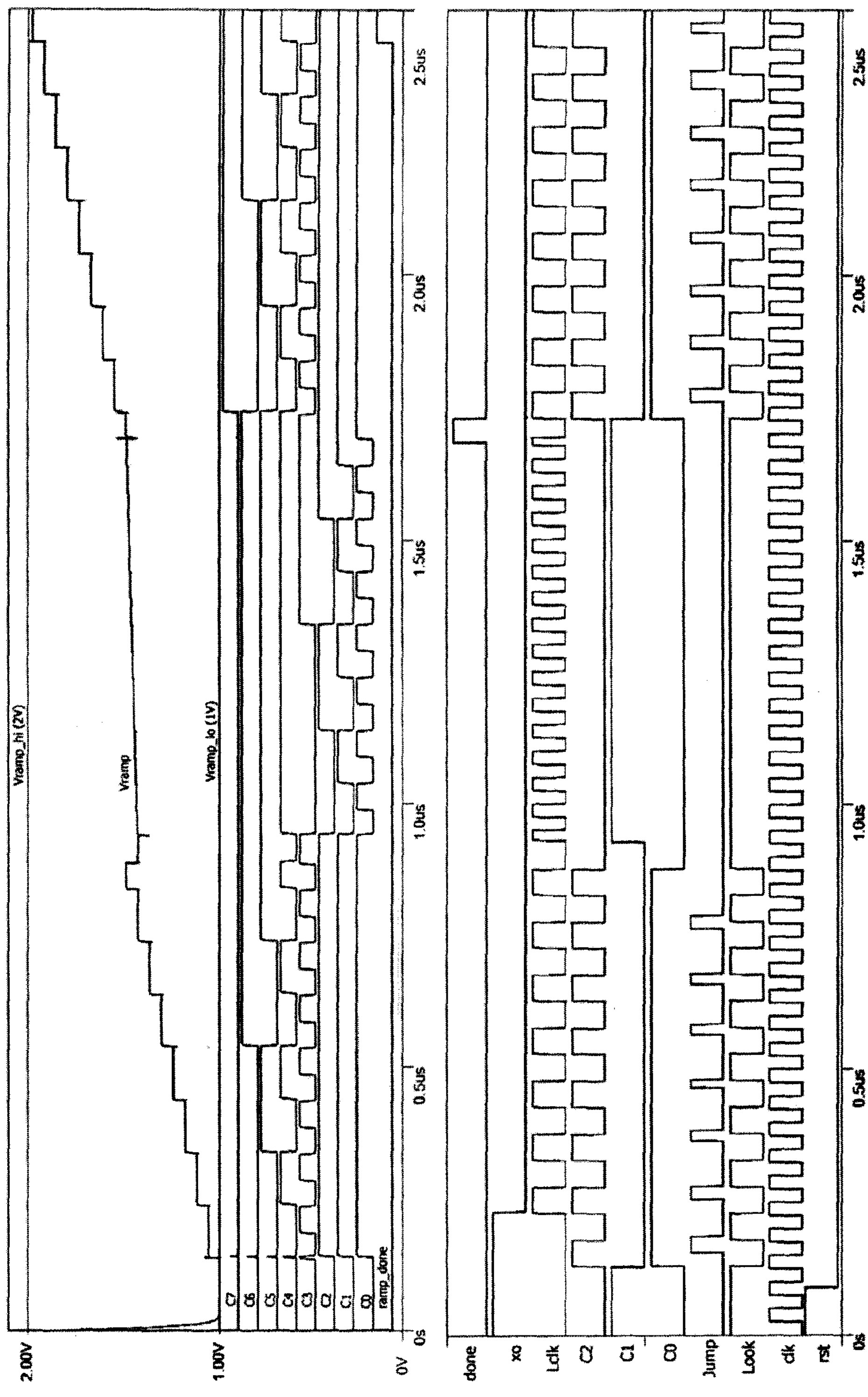
FIG. 29 is a timing diagram showing simulation results of the ADC's controller and ramp-count generator unit with a step of 16 LSB.
Figure 30:
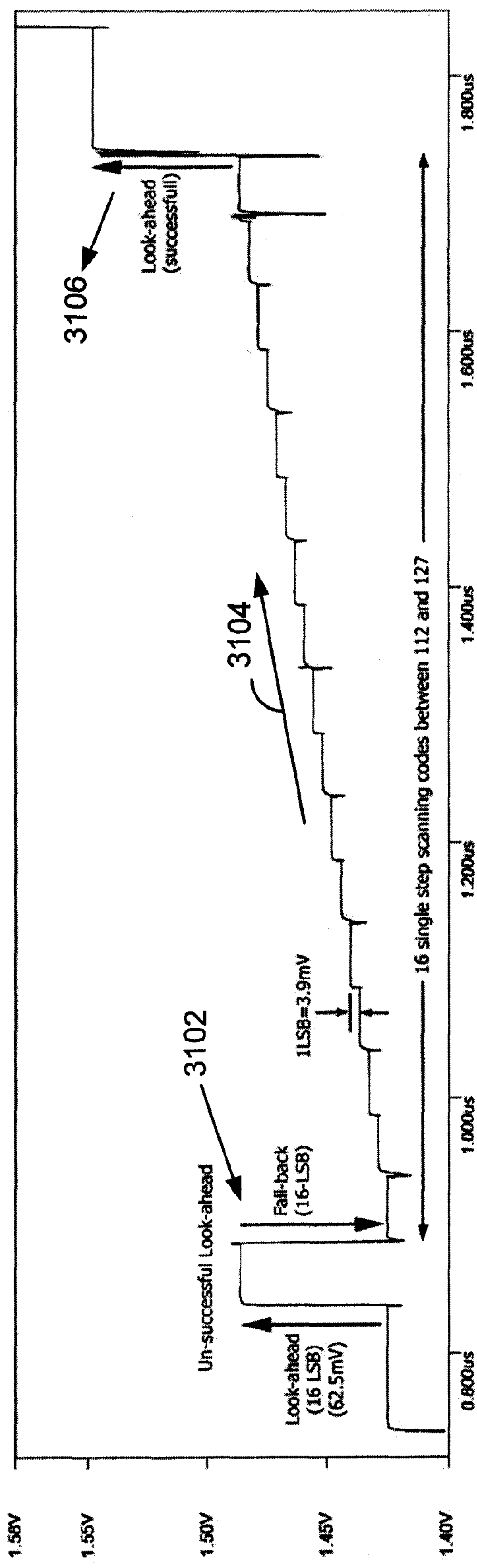
FIG. 30 shows a simulation result for a ramp output voltage for a failed look-ahead operation.

Full operation of the FSM 1902 and ramp-count generator 1702 with simulated jump input can be seen in FIG. 29. Full 8-bit ADC simulation results for a step size 16-LSB is shown in FIG. 30. In the simulation, jump input is forced to allow code jump operation in all but one 16-LSB code range between 112 (01110000) and 127 (01111111). Ramp low and ramp high levels were set to 1.0 and 2.0 volt. A zoomed version of the Vramp signal is shown in FIG. 31. The single LSB is 3.906 mV (=(2V−1V)/256). The jump step is shown at 3102 and was not successful so a fall back occurs to the previous voltage level. The substantially ramped output is shown at 3104, as a series of voltage-steps (fixed increments) in voltage. A successful jump step is shown at 3106.

It will be recognized that the circuits described herein are only examples that can be implemented in a variety of ways. For example, the look-ahead controller 530, the predictor circuits 520, the ramp generator 508 and counter 540 can be implemented using a variety of designs. The particular circuits are only illustrative of possible designs.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

I claim:

1. An analog-to-digital converter, comprising:

a programmable ramp generator for providing a substantially ramped output voltage that increases at a first trajectory and for receiving input that allows for a jump step in voltage to move the ramped output to a second trajectory, wherein an amount of the jump step is dynamically programmable;

a plurality of comparators, each having a first input coupled to the ramp generator, a second input coupled to a respective analog input voltage to be converted to digital, and a respective comparator output;

a plurality of latches coupled to the comparator outputs; and a counter coupled to the latches for latching a counter count in response to the comparator outputs.

2. The analog-to-digital converter of claim 1, further comprising:

a look-ahead controller coupled to the outputs of the comparators, the programmable ramp generator, and the counter, the look-ahead controller for generating a signal causing the jump step in the ramped output voltage and an associated change in the counter count and for detecting changes in the comparator outputs in response to the step in the ramped output voltage.

3. The analog-to-digital converter of claim 1, further including a predictor circuit coupled between each comparator output and corresponding latch, for providing an indication to the look-ahead controller that the comparator changed states.

4. The analog-to-digital converter of claim 3, wherein the predictor circuit includes a capacitor coupled at one end to the respective comparator output and an opposing end to the look-ahead controller.

5. The analog-to-digital converter of claim 4, wherein each predictor circuit is coupled to a shared line that is used as input to the event detector for determining whether the jump step should occur.

6. The analog-to-digital converter of claim 1, wherein the analog input voltages are provided from image sensors.

7. The analog-to-digital converter of claim 1, wherein the look-ahead controller includes a finite state machine that sends control signals to the programmable ramp generator.

8. The analog-to-digital converter of claim 1, wherein the programmable ramp generator includes a counter having an adder and a subtractor.

9. The analog-to-digital converter of claim 1, wherein the programmable ramp generator receives the dynamically programmable jump-step input from an external source and uses the input in an adder circuit to calculate a starting voltage of the second trajectory.

10. A method of converting a plurality of analog input signals to digital in an image sensor, comprising:

receiving programming inputs to a programmable ramp generator in order to set a jump step voltage;

ramping a voltage level that is input to a comparator at a substantially constant rate;

jump stepping the ramping voltage level from a first voltage level corresponding to the substantially constant rate to a second voltage level that does not correspond to the substantially constant rate; and continuing the ramping from the second voltage level, an amount of jump stepping corresponding to the programming inputs in order to speed the conversion of analog input signals to digital.

11. The method of claim 10, further including detecting a number of the analog input signals that were not properly converted to digital due to the jump stepping.

12. The method of claim 11, further comprising:

if the detected number is above the predetermined threshold, decreasing the ramping voltage level back to the first voltage level and continuing with the analog to digital conversion.

13. The method of claim 10, further comprising:

if the detected number is below the predetermined threshold, jump stepping a counter count used in the digital conversion so that it corresponds to the ramping voltage at the second voltage level; and if the detected number is above the predetermined threshold, reducing the counter count so that it corresponds with the ramping voltage at the first voltage level.

14. The method of claim 10, wherein jump stepping the ramping voltage level is k steps and further including jump stepping a counter count k/2 steps.

15. The method of claim 10, wherein if the detected number is below the predetermined threshold, jump stepping the counter an additional k/2 steps.

16. The method of claim 10, wherein the method is performed for a first row in the image sensor and repeating the method for multiple rows in the image sensor.

17. The method of claim 10, wherein the image sensor is a CMOS image sensor with column parallel architecture.

18. The method of claim 10, further including dynamically modifying the programming inputs after the jump step occurred in order to change an amount of voltage change associated with a next jump step.

19. An image sensor, comprising:

a pixel array having multiple row selectors with multiple output columns;

an analog-to-digital converter comprising the following:

a) a plurality of comparators coupled in parallel having a first input coupled to a ramping voltage signal line and a second input coupled to the multiple columns in a one-to-one relationship;

b) a plurality of latches coupled to the comparators in a one-to-one relationship, the comparators coupled to a control line of the latch;

c) a plurality of predictor circuits coupled between the plurality of latches and the plurality of comparators;

d) a look-ahead controller having an input signal line coupled to the plurality of predictor circuits for generating a signal indicating that a jump step in voltage should occur;

e) a programmable ramp generator coupled to the look-ahead controller and responsive to the signal indicating that a jump step should occur, the programmable ramp generator having an input port for receiving input controlling an amount of voltage level increase associated with the jump step; and f) a counter coupled in parallel to the plurality of latches for providing a digital value of the analog signal, which is latched in response to a change in the control line of the latch, the counter further coupled to the look-ahead controller.

20. The image sensor of claim 19, wherein each predictor circuit includes a capacitor having one end coupled to its respective comparator and a second end coupled to the input signal line of the look-ahead controller.

21. The image sensor of claim 19, wherein the look-ahead controller includes a finite state machine for controlling the programmable ramp generator.

22. The image sensor of claim 19, wherein the ramp generator includes a counter implemented using an adder and a subtractor.

* * * * *